US011138083B2

(12) United States Patent
Eder et al.

(10) Patent No.: US 11,138,083 B2
(45) Date of Patent: *Oct. 5, 2021

(54) APPARATUSES AND METHODS FOR A MULTIPLE MASTER CAPABLE DEBUG INTERFACE

(71) Applicant: Intel Corporation, Santa Clara, CA (US)

(72) Inventors: Patrik Eder, Taufkirchen (DE); Rolf H. Kuehnis, Portland, OR (US); Enrico D. Carrieri, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 16/596,154

(22) Filed: Oct. 8, 2019

(65) Prior Publication Data

US 2020/0034260 A1 Jan. 30, 2020

Related U.S. Application Data

(63) Continuation of application No. 15/474,799, filed on Mar. 30, 2017, now Pat. No. 10,481,990.

(60) Provisional application No. 62/349,359, filed on Jun. 13, 2016.

(51) Int. Cl.
*G06F 11/25* (2006.01)
*G06F 11/267* (2006.01)
*G01R 31/317* (2006.01)

(52) U.S. Cl.
CPC ............ *G06F 11/25* (2013.01); *G06F 11/267* (2013.01); *G01R 31/31705* (2013.01)

(58) Field of Classification Search
CPC .. G06F 11/25; G06F 11/267; G01R 31/31705
See application file for complete search history.

(56) References Cited

U.S. PATENT DOCUMENTS

| 5,621,651 | A | 4/1997 | Swoboda |
| 6,142,683 | A | 11/2000 | Madduri |
| 6,950,963 | B1 | 9/2005 | Parson et al. |
| 7,055,136 | B2 | 5/2006 | Dzoba et al. |
| 7,665,002 | B1 | 2/2010 | White et al. |
| 2003/0046625 | A1 | 3/2003 | Menon et al. |
| 2004/0064757 | A1 | 4/2004 | Jahnke |

(Continued)

OTHER PUBLICATIONS

Nijinda C A., "A Hierarchical DFT Architecture for Chip, Board and System Test/Debug," ITC International Test Conference, 2004, pp. 1061-1071.

(Continued)

*Primary Examiner* — Cynthia Britt
(74) *Attorney, Agent, or Firm* — Nicholson De Vos Webster & Elliott LLP

(57) ABSTRACT

Methods and apparatuses relating to a multiple master capable debug interface are described. In one embodiment, an apparatus includes a device circuit, a wireless connector circuit, and a switching circuit coupled between the device circuit and the wireless connector circuit to switch a debug and test mastership from the wireless connector circuit to a debug and test tool, wirelessly connected to the wireless connector circuit, to perform a debug and test operation on the device circuit.

24 Claims, 20 Drawing Sheets

(56) References Cited

U.S. PATENT DOCUMENTS

| | | | |
|---|---|---|---|
| 2006/0179374 A1* | 8/2006 | Noble | G01R 31/3025 714/727 |
| 2014/0298122 A1 | 10/2014 | Brambilla et al. | |
| 2015/0089289 A1* | 3/2015 | Gahoi | G01R 31/3177 714/30 |
| 2015/0149843 A1 | 5/2015 | Finan | |
| 2017/0269157 A1 | 9/2017 | Mao | |

OTHER PUBLICATIONS

Notice of Allowance from U.S. Appl. No. 15/474,799, dated Jul. 18, 2019, 10 pages.

* cited by examiner

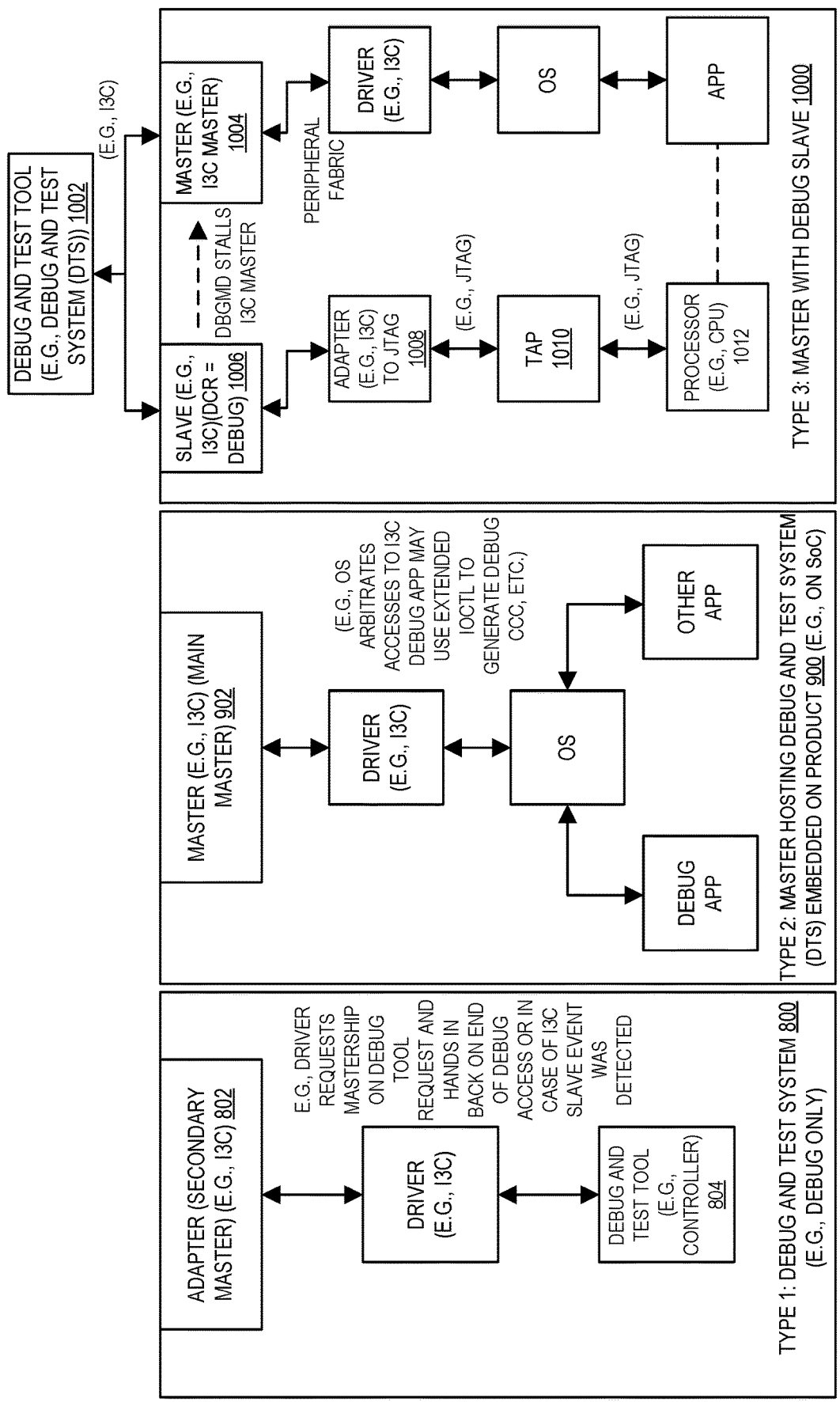

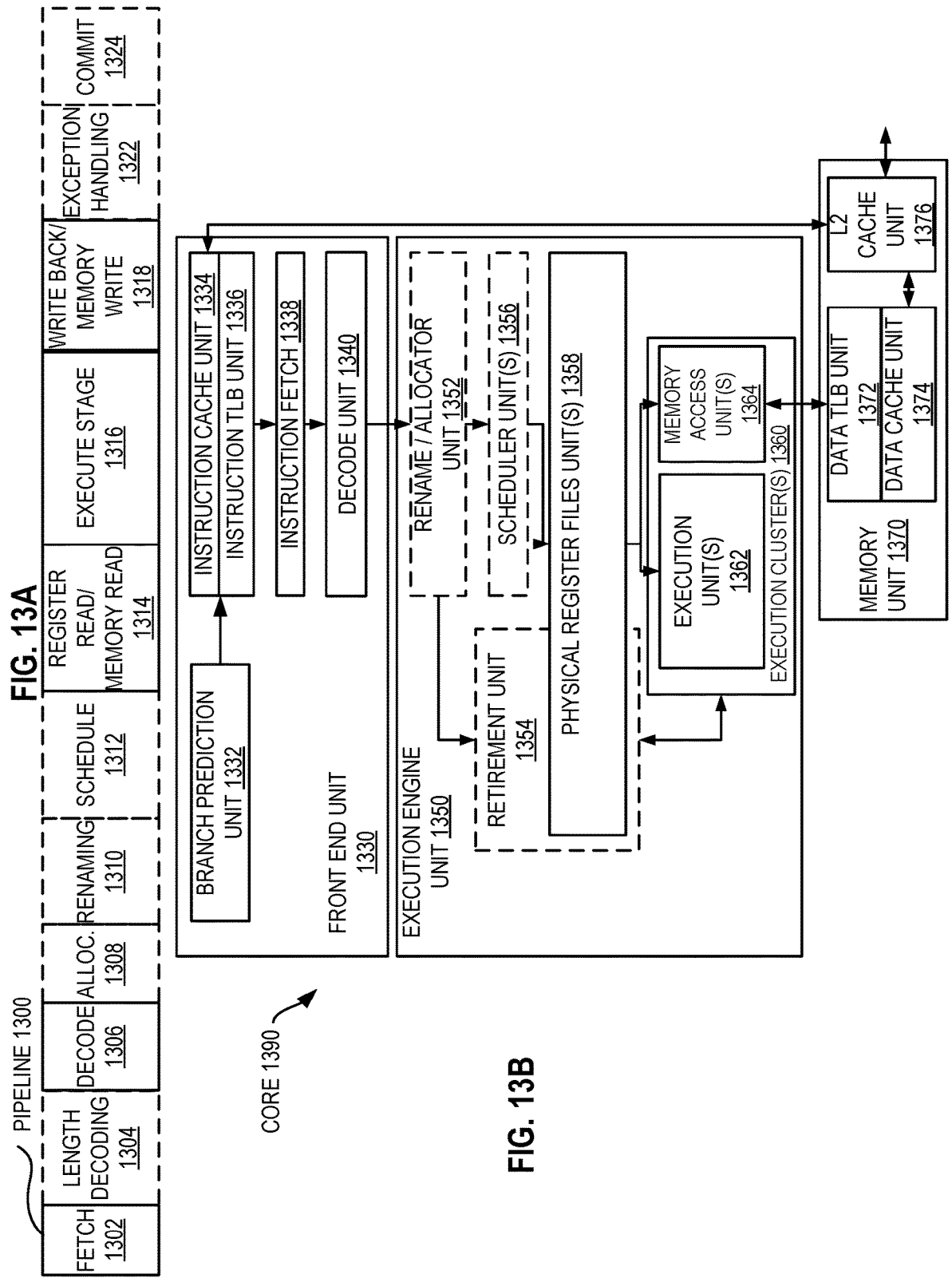

APPARATUSES AND METHODS FOR A MULTIPLE MASTER CAPABLE DEBUG INTERFACE

CROSS REFERENCE TO RELATED APPLICATIONS

The present patent application is a continuation application claiming priority from U.S. patent application Ser. No. 15/474,799, filed Mar. 30, 2017, and titled: "Apparatuses and Methods for a Multiple Master Capable Debug Interface", which claims the benefit of U.S. Provisional Patent Application No. 62/349,359, filed Jun. 13, 2016, and titled: "Apparatuses and Methods for a Multiple Master Capable Debug Interface", both of which are incorporated herein by reference in their entirety.

TECHNICAL FIELD

The disclosure relates generally to electronics, and, more specifically, an embodiment of the disclosure relates to a switching circuit to switch between debugging with a dedicated debug and test access port and with a data access port.

BACKGROUND

An integrated circuit (IC) may include multiple components and connections, such as to a motherboard, mainboard, or other circuit board. The connection may comprise a terminal on the IC (e.g., a bond pad, a copper pillar or stud bump, etc.) that is electrically coupled (e.g., by reflowed solder) to a mating terminal (e.g., a pad, pillar, or stud bump) on the substrate. Alternatively, by way of further example, the IC die may be attached to the substrate by a layer of die attach adhesive, and a plurality of wire bonds may be formed between the die and substrate. An IC may be disposed on one side of a substrate, and a number of electrically conductive terminals are formed on an opposing side of the substrate. The terminals on the opposing side of the substrate will be used to form electrical connections with the next-level component (e.g., a circuit board), and these electrical connections may be used to deliver power to the die and to transmit input/output (I/O) signals to and from the die. The electrically conductive terminals on the substrate's opposing side may comprise an array pins, pads, lands, columns, bumps etc., and these terminals may be electrically coupled to a corresponding array of terminals on the circuit board or other next-level component. The terminals on the package substrate's opposing side may be coupled to the next-level board using, for example, a socket (and retention mechanism) or by a solder reflow process.

BRIEF DESCRIPTION OF THE DRAWINGS

The present disclosure is illustrated by way of example and not limitation in the figures of the accompanying drawings, in which like references indicate similar elements and in which:

FIG. 8 illustrates a debug and test system with an adapter as a secondary master according to embodiments of the disclosure.

FIG. 9 illustrates a debug and test system embedded on a product as a secondary master according to embodiments of the disclosure.

FIG. 10 illustrates a system having a debug and test tool coupled to a master with a debug slave according to embodiments of the disclosure.

FIG. 13A is a block diagram illustrating both an exemplary in-order pipeline and an exemplary register renaming, out-of-order issue/execution pipeline according to embodiments of the disclosure.

FIG. 13B is a block diagram illustrating both an exemplary embodiment of an in-order architecture core and an exemplary register renaming, out-of-order issue/execution architecture core to be included in a processor according to embodiments of the disclosure.

DETAILED DESCRIPTION

Figure 1A:
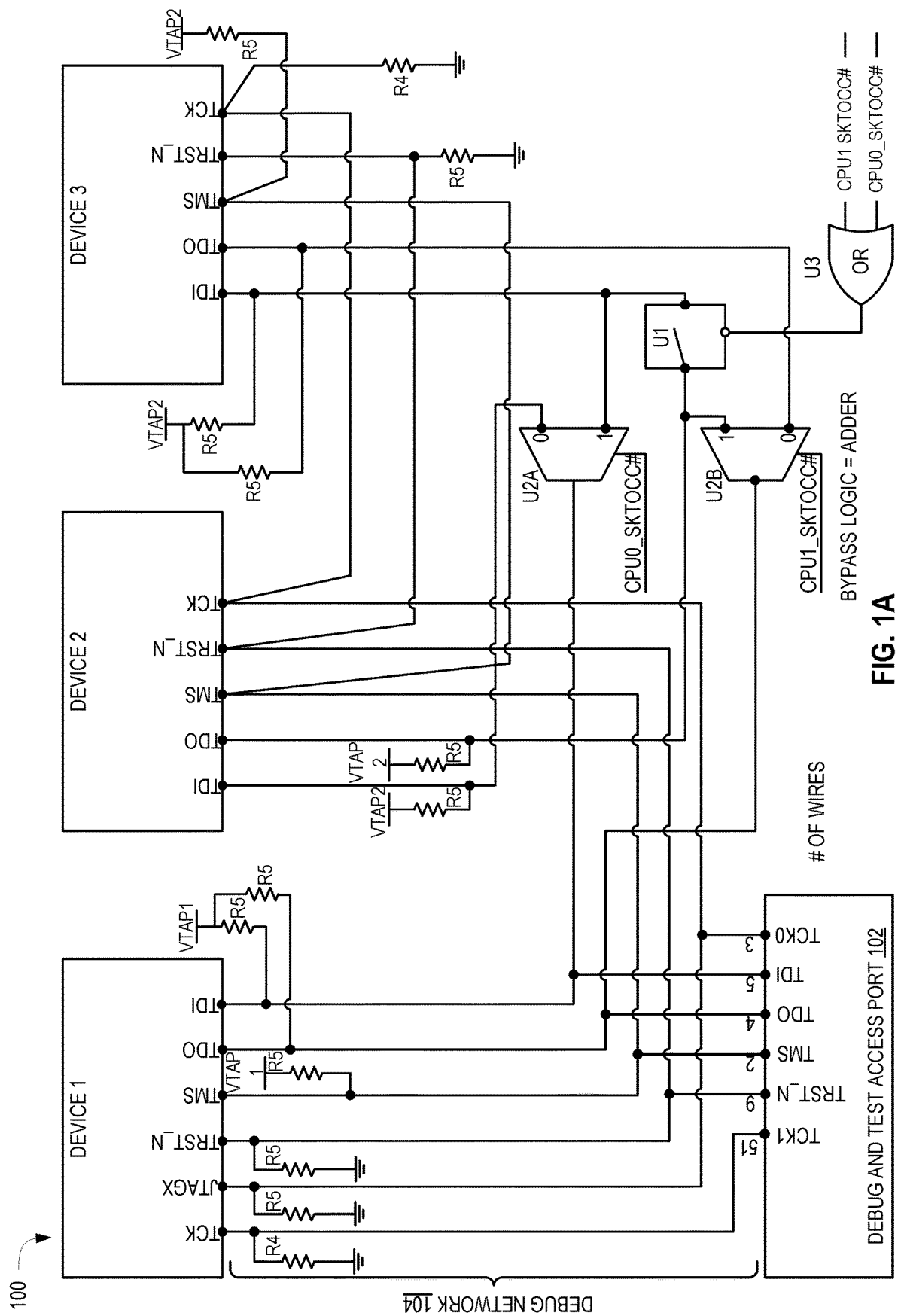
FIG. 1A illustrates a circuit with a debug and test access port according to embodiments of the disclosure.

In the following description, numerous specific details are set forth. However, it is understood that embodiments of the disclosure may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In certain embodiments, debug and test hardware (and software) is utilized to debug and test certain components, e.g., circuits or other hardware. In one embodiment, debugging and testing may include instruction tracing and data tracing. The Joint Test Action Group (JTAG) is the common name for what is standardized as the IEEE 1149.1 Standard Test Access Port and Boundary-Scan Architecture (2013). Debugging and testing according to the IEEE 1149.1-2013 (JTAG) standard may include testing printed circuit boards (e.g., using boundary scan), integrated circuits (e.g., processors, controllers, etc.), embedded systems, and other components. Debugging and testing hardware may be used for performing debug testing of sub-blocks of integrated circuits.

In certain embodiments, debugging and testing capabilities are implemented via hardware that is built into the device being tested (e.g., referred to as the device under test or DUT) and an external tester (e.g., hardware) that connects to the DUT via a debug and/or test port (e.g., a physical connection to the port) and provides stimulus and control signals to the DUT to implement various tests (e.g., scan tests and logic debug tests) and receives test result signals and data output from the DUT. This test result data and signals may then be utilized (e.g., processed) to verify the operation of the DUT. A DUT may be a target component or target systems. In certain embodiments, devices such as processors or Systems on a Chip (SoCs) have pins that are electronically connected to the external (e.g., JTAG) tester via a debug and test access port coupled to a socket the processor is mounted in. Similar debug and test access ports may be provided at the board level. In one embodiment, debugging and testing access port is used only for design debug, and the production device (e.g., circuit boards) do not include a debug and test access port (e.g., debug port), debug port connector, or other type of debug and testing (e.g., JTAG) interface or the operability of that debug and test access port (e.g., debug port), debug port connector, or other type of debug and testing (e.g., JTAG) interface is deactivated.

Current and new devices (e.g., or platforms) may be more and more a mix of different components (e.g., or devices) and the lifetime and scope of debugging and testing may change, in addition to any device changes. For example, in early states (e.g., before being used by a consumer), a device (e.g., a physical connector) may be directly physically accessible, but later on it may not be accessible. For example, certain devices (e.g., computing devices) may not include a physical connector, a physical connector may be pin limited, or replaced by wireless link(s). In one embodiment, debug and test hardware (and software) may not communicate through a closed chassis interface of a device (e.g., to dies other than the directly connected die). Some embodiments may only allow a single master (e.g., having a mastership) to a plurality of devices and/or components, for example, such that debug and test hardware is always the only master on the debug bus. Certain embodiments herein may provide for a mastership to be transferred to other devices (e.g., on a single SoC or circuit board). Some embodiments may include interfaces that do not allow for a plurality of connections (e.g., 1 to N connections) between devices and/or components, e.g., they are one-to-one connections only. A mastership may refer to a device that performs (e.g., controls) debugging and testing. This may lead to lesser available debug and test connections, e.g., for links which are available from power on and in all power states. Certain embodiments herein may provide for a plurality of connections, e.g., such that one or a plurality of connected devices may obtain a mastership and communicate with the other connected devices and/or components.

For example, FIG. 1A illustrates a circuit 100 with a debug and test access port 102 according to embodiments of the disclosure. In one embodiment, circuit 100 may be a system on a chip (e.g., including a plurality of cores). Depicted circuit 100 includes a device circuit that includes three devices (device 1, device 2, and device 3), for example, a platform control hub and two cores. A device circuit may include no processor or cores (e.g., it may include hardware logic circuitry). A debug and test access port may include a connector that receives a connector (e.g., to form an electrical connection therebetween) of a debug and test tool (e.g., hardware and/or software). A debug and test tool may be a part of a debug and test system (e.g., DTS), debug pod, host tool, etc. In one embodiment, a debug and test system includes the hardware and software running on that hardware to perform debug and test operation(s). A debug and test tool may be a separate computer (e.g., hardware processor) or testing hardware that performs the debugging and testing operation(s). A debug and test tool may include a debug and test controller (DTC), e.g., a hardware system that is responsible for managing communications with a system (e.g., device) being debugged (e.g., the target system).

Depicted circuit 100 includes a (e.g., physical) connection between debug and test access port 102 and device 1. The discrete connections in circuit 100 include test clock (TCK), to provide the clock for the debug and test tool; test mode select (TMS), to provide the signal that is decoded (e.g., by the test access port (TAP) controller) to control test operations of the debug and test tool; test data input (TDI), to provide the (e.g., serial) test instructions and data that are received by the debug and test tool at TDI; test data output (TDO), to provide the (e.g., serial) output for test instructions and data from the debug and test tool; JTAGX, this is the (Design for Manufacturability, Testability and Debuggability) DFx pin used to support debug port topologies; and test reset (TRST or TRST_N), used to reset the debug and test tool. Connections in circuit 100 may form a debug network 104 between the devices (e.g., and a device's discrete debug and test access connections) and/or an external (e.g., from the device) debug and test access port 102. In one embodiment, each of devices is a component of a SoC and the SoC includes a (e.g., single) debug and test access port 102.

In one embodiment of circuit 100, a device to be debugged and tested (for example, device 1) is not able to obtain a mastership to perform the debug and test operations, e.g., due to fixed directions of the pins and the predefined flow of data. A device like device 1 may need to be extended by a master capable interface, e.g., be able to generate a clock on TCK. Certain embodiments herein may allow a (e.g., any) device of a multiple device system to obtain a mastership to perform a debug and test operation. In one embodiment, debug and test access port 102 may be removed or deactivated, for example, with a device (e.g., device 1, device 2, and device 3) obtaining the mastership, e.g., in contrast to a debug and test device plugged into debug and test access port 102 obtaining the mastership, e.g., when plugged into the debug and test access port 102. In certain embodiments, a device is to include a clock generator to generate a (e.g., test) clock signal for debug and test, e.g., TCK in FIG. 1A.

Figure 1B:
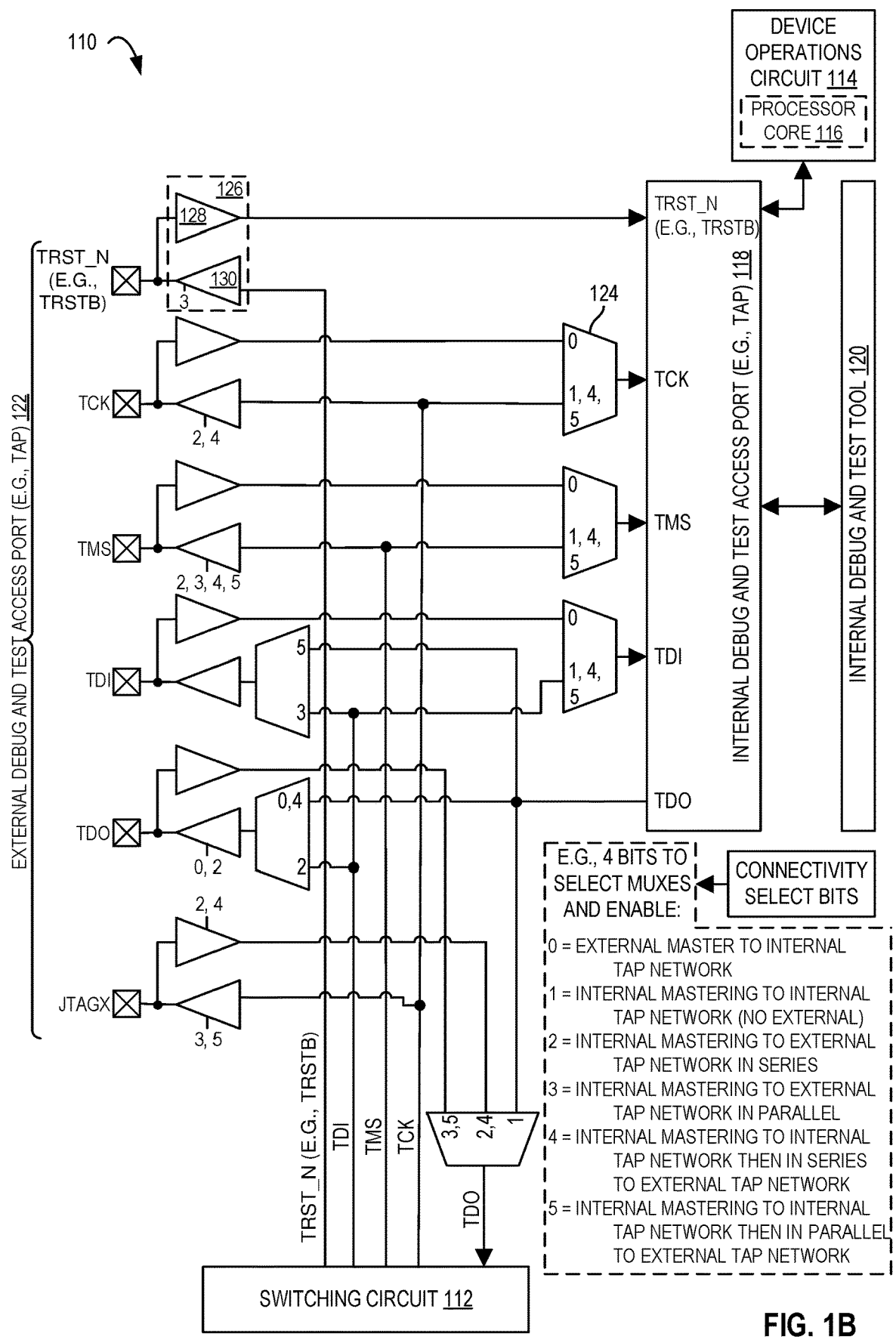
FIG. 1B illustrates a device with a switching circuit to switch a mastership according to embodiments of the disclosure.
Figure 1C:
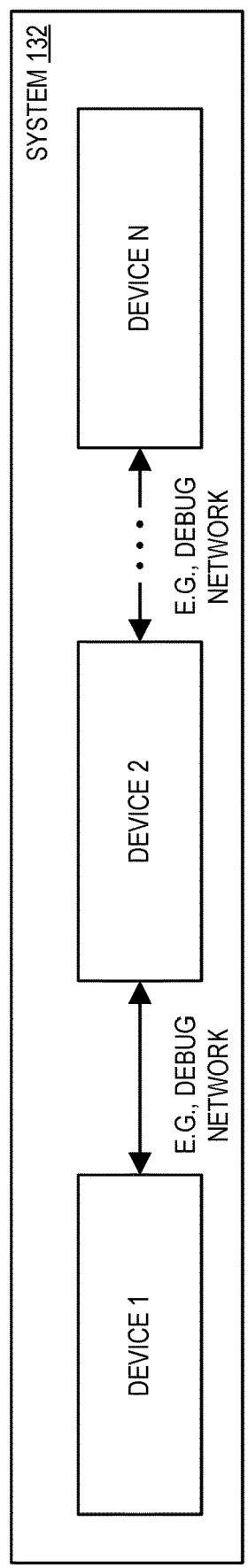
FIG. 1C illustrates a system having multiple devices connected by a debug network according to embodiments of the disclosure.

FIG. 1B illustrates a device 110 with a switching circuit 112 to switch a mastership (for example, switch which component is the master that is controlling a debug and/or test operation of other devices (e.g., slaves) and/or itself) according to embodiments of the disclosure. In one embodiment, device 110 is any (e.g., or all) of device 1, device 2, and device 3 in FIG. 1A and/or device 1, device 2 . . . and device N in FIG. 1C. In one embodiment, device 110 in FIG. 1B is a device (or component) of a computing system. In the depicted embodiment, device 110 includes device operations circuit 114. Device operations circuit 114 may include a processor core 116 (e.g., including registers and/or other memory), SoC, wireless connector circuit (e.g., modem/Wi-Fi device), or other hardware circuitry. A system (e.g., SoC) may include multiple devices, e.g., each being an instance of device 110, for example, two or more devices or three or more devices (e.g., as shown in FIG. 1C). In certain embodiments, an access port (e.g., a debug and test access port or TAP) is a port conforming to (e.g., operates according to) Institute of Electrical and Electronic Engineers (IEEE) Standard 1149.1 of 2013 (IEEE Standard for Test Access Port and Boundary-Scan Architecture) and/or IEEE Standard 1149.7 of 2009 (IEEE Standard for Reduced-pin and Enhanced-functionality Test Access Port and Boundary Scan Architecture).

Depicted device operations circuit 114 is coupled (for example, (e.g., physical) electrically coupled) to an internal debug and test access port (e.g., TAP) 118. Depicted internal debug and test access port 118 is coupled (for example, (e.g., physical) electrically coupled) to an internal debug and test tool 120. Depicted internal debug and test tool 120 is a separate component from device operations circuit 114. In one embodiment, internal debug and test tool 120 is a component within device operations circuit 114. Internal debug and test tool 120 may be the hardware that is responsible for managing the debug and test operations. In one embodiment, debug and test operations include debug functions such as run control, providing debug access to system resources, processor trace (e.g., instruction trace and/or data trace), or test capability, e.g., operation(s) to verify all or a portion of the functionality of a device or circuit. Switching circuit 112 is coupled (for example, (e.g., physical) electrically coupled) between internal debug and test access port 118 and external debug and test access port 122. External debug and test access port 122 may couple to the external debug and test access port(s) or another device or devices (e.g., in series or parallel). Switching circuit 112 may include a logic circuit to selectively couple components together. Depicted switching circuit 112 includes a plurality of multiplexers (muxes), for example, mux 124, to couple external debug and test access port, internal debug and test access port, and/or an internal debug and test tool. In one embodiment, control signals (e.g., over control lines (not shown)) are sent from a first device (e.g., from a switching circuit of a first device) to another device or devices (e.g., to a respective switching circuit of each connected device). For example, switching circuit 112 may include a transceiver (e.g., transceiver 126 including a receiver 128 and a transmitter 130) for each channel (e.g., line) thereof to control (e.g., via a control signal) the input and output of data by device 110, e.g., by external debug and test access port 122. In one embodiment, for example, as shown in FIG. 1C, a network (e.g., a dedicated debug network) is between one or more of the devices, for example, such that the external debug and test access port of each device connects to the network. As an example, switching circuit 112 may include one or more of the following modes (e.g., as indicated by the connectivity select values of 0-5): 0=external mastering to internal debug and test tool, 1=internal mastering to internal debug and test tool (no external), 2=internal mastering to external debug and test tool(s) in series, 3=internal mastering to external debug and test tool(s) in parallel, 4=internal mastering to internal debug and test tool then in series to external debug and test tool(s), and 5=internal mastering to internal debug and test tool then in parallel to external debug and test tool(s).

The discrete connections in devices (e.g., device 110) include test clock (TCK) to provide the clock for the debug and test tool (e.g., to the other devices); test mode select (TMS), to provide the signal that is decoded (for example, by the debug and test tool (e.g., the test access port (TAP) controller)) to control test operations of the debug and test tool; test data input (TDI), to provide the serial test instructions and data that are received by the debug and test tool at TDI; test data output (TDO), to provide the (e.g., serial) output for test instructions and data from the debug and test tool; JTAGX, this is the (Design for Manufacturability, Testability and Debuggability) DFx pin used to support debug port topologies; and test reset (TRST) used to reset the debug and test tool(s). Device 110 (e.g., the discrete connections thereof) may connect to the external debug and test access ports of other devices, e.g., as in FIG. 1C.

FIG. 1C illustrates a system 132 having multiple devices connected by a debug network(s) according to embodiments of the disclosure. In one embodiment, a pair of devices has a debug network therebetween (e.g., as in FIG. 1C). In one embodiment, each of the devices connects to a single debug network.

In certain embodiments, hardware (for example, a coupling (e.g., a bus, interconnect, connector thereto, etc.)) and/or software is according to a standard, for example, the I3C specification ratified in September 2015 by the MIDI Alliance.

Figure 2:
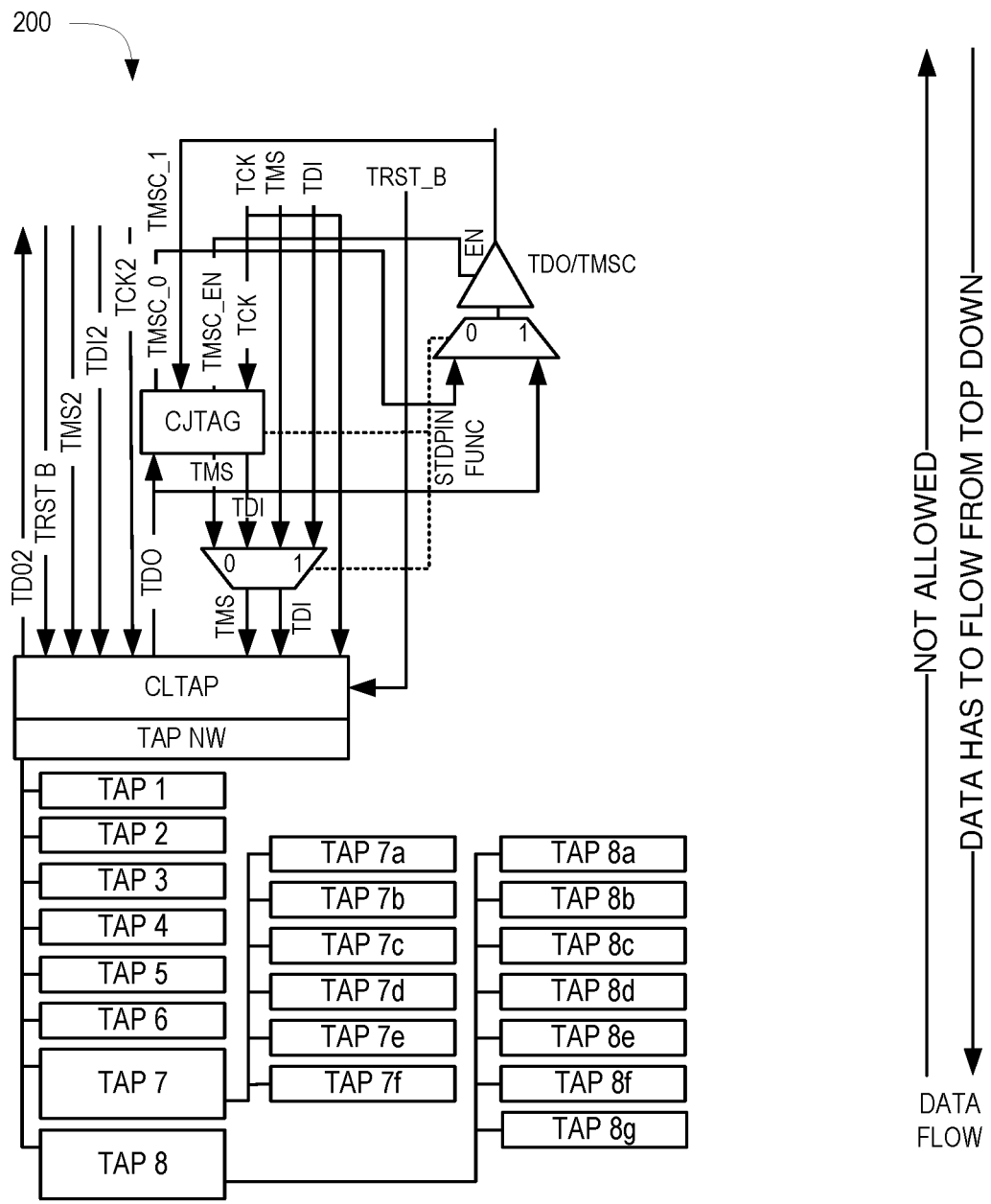
FIG. 2 illustrates a data exchange of a circuit according to embodiments of the disclosure.

FIG. 2 illustrates a data exchange 200 of a circuit according to embodiments of the disclosure. In the depicted embodiment, data flows from the top down and is not allowed from the top up. A master capable device (e.g., test access port (TAP)) may access itself, which depending on the operation, may lead to a deadlock. For example, there may be no means in the (e.g., JTAG) addressing to prohibit this. A debug and test (e.g., according to the JTAG standard) may not allow a peer to peer data exchange, for example, the debug and test tool (e.g., system) may be the sole device generating transactions. A top to bottom data exchange (as shown in FIG. 2) may hinder a multiple master (e.g., switchable) solution. From an electrical standpoint, certain debug and testing operations (e.g., according to JTAG or compact JTAG (cJTAG) standards) may lack of defining a clear termination methodology which may lead to incompatibilities between device vendors. Similar limitations may apply in different variances to other interfaces, such as, but not limited to, cJTAG, ARM's serial wire debug (SWD) and usage of non-debug interfaces. For example, cJTAG may not allow a target device to change its (e.g., debug and test) role (e.g., from being a non-master (slave) to being a master in control of the slaves).

Certain embodiments herein (instead of allowing only one (e.g., type) of device to take over a mastering role) allow any device to take the mastership (e.g., lead). In one embodiment, at start of the debug and test operation, the debug and test tool is able to access all the participants (e.g., devices or target system (TS)) directly, e.g., the chassis is open or a dedicated physical connection is available. In a later stage, the participants (e.g., chassis) may be closed or the physical connection (connector) may not be available (e.g. fully closed form factor).

Figure 3:
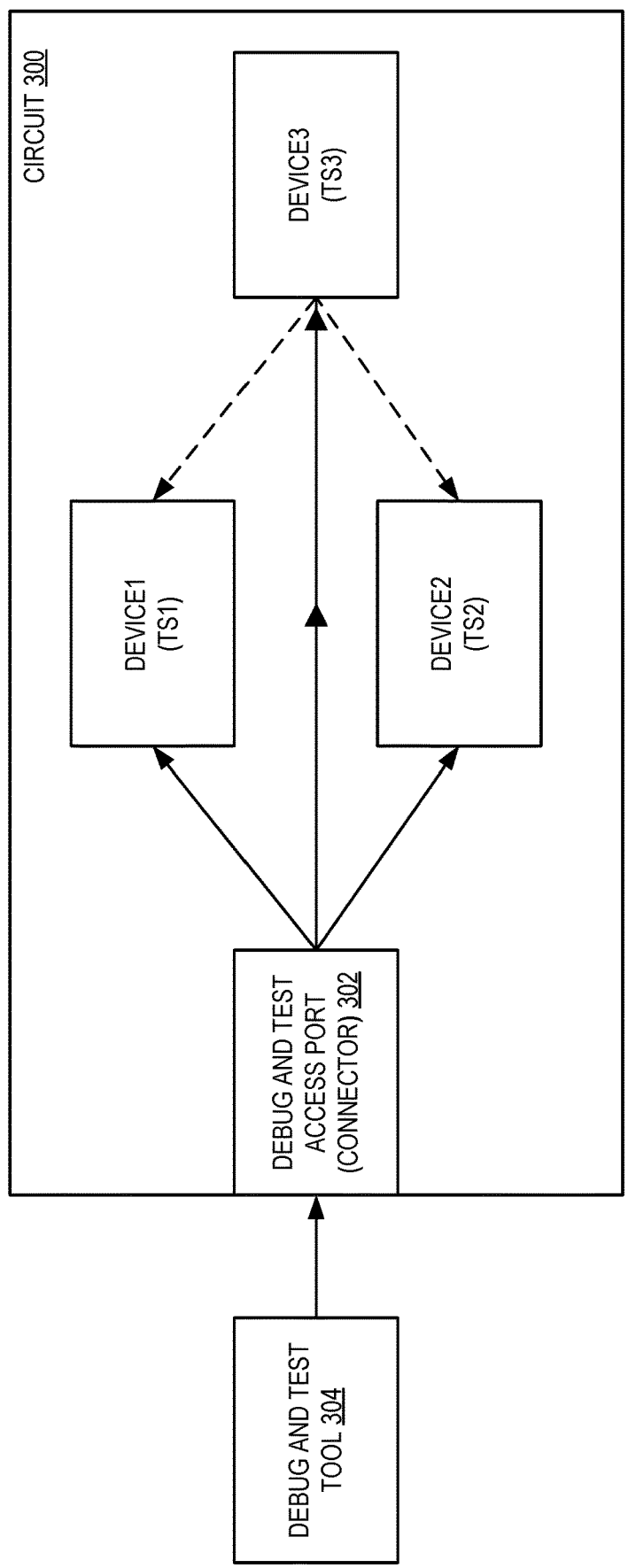
FIG. 3 illustrates a circuit with a debug and test access port according to embodiments of the disclosure.

FIG. 3 illustrates a circuit 300 with a debug and test access port 302 according to embodiments of the disclosure. Circuit 300 may be an integrated circuit or circuit board (e.g., system). Debug and test access port 302 may include a connector (e.g., to connect to a cable having connectors on each end) that connects to one or more of devices (e.g., target systems 1-3). In one embodiment, device 1 is a System on a Chip (SoC), device 2 is a System in a Package (SiP), and device 3 is a wireless access device or modem (e.g., for a wireless local area network (e.g., Wi-Fi) or a wireless wide area network (e.g., LTE or other cellular network). Debug and test tool 304 may connect (e.g., initially) to the circuit 300 through debug and test access port 302 (e.g., a physical connector thereof). In one embodiment, debug and test access port 302 (e.g., a physical connector thereof) is dedicated to debug and test (e.g., and not to transport other non-debug data and/or non-test data), for example, according to one of the standards discussed herein. In one embodiment, device 1 and device 2 are each a SoC and device 3 is a device enabled with data (e.g., wireless) access of any sort to device 1 and/or device 2, e.g., via a wired or wireless data access port of (e.g., built into) the devices. Debug and test tool 304 may perform the (e.g., initial) debug and test operations on one or more of the devices 1-3. Circuit 300 may include a switching circuit (or switching hardware logic) to switch the mastership between devices. In one embodiment, debug and test tool 304 (e.g., initially) has the mastership for circuit 300 (e.g., debug and test tool 304 is in the master for performing the debug and test operations). In one embodiment, device 3 (e.g., target system TS3) takes over the mastering role, e.g., allowing either debug and test tool 304 to contact with target system TS1 and target system TS2 over a wireless connection instead of the physical connector. In another embodiment, device 3 (e.g., target system TS3) hosts the debug and test hardware and/or software (e.g., the debug and test functionality), for example, and is used to debug TS1 and/or TS2 (e.g., debug and test tool is integrated into TS3). In one embodiment, there are multiple devices in a system and each device may obtain mastership, for example, a debug and test mastership, e.g., separate from any data transfer mastership. For example, a system may have one master and a plurality of slaves (e.g., clients). As a further example, a system (e.g., system on a chip in the Figures discussed below) may include multiple devices (e.g., components) which may take on a mastership, e.g., a debug and test mastership.

Figure 4:
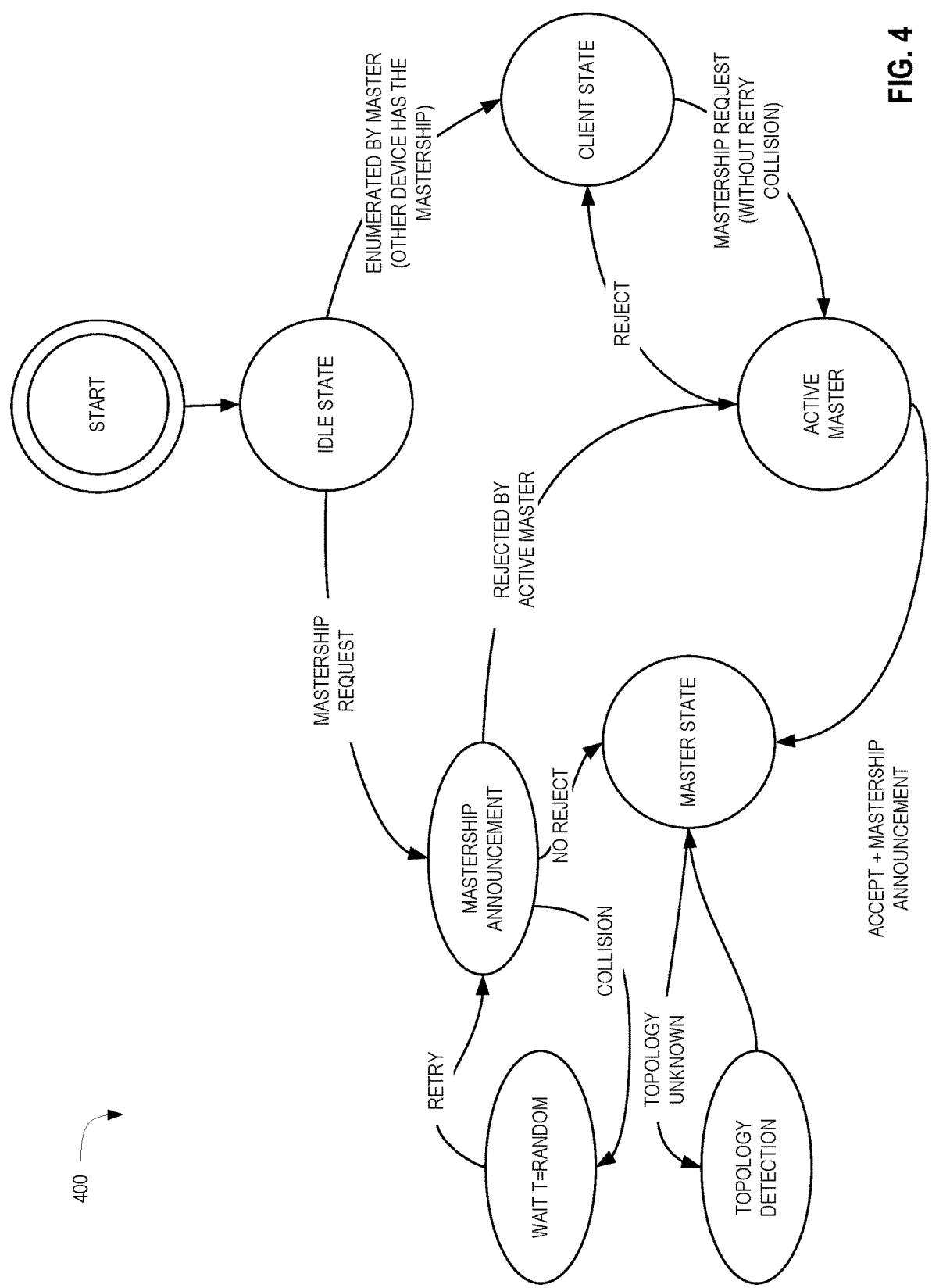
FIG. 4 illustrates flow schematic of a startup according to embodiments of the disclosure.

FIG. 4 illustrates flow schematic of a startup 400 according to embodiments of the disclosure. In one embodiment, a device under test may be one device in a system (e.g., on a set of die) or in a platform of discrete devices which are all interconnected, e.g., by a debug interface (e.g., network). The (e.g., basic) setup may then begin a debug and test operation, e.g., after power on all devices/die are in an idle state and await a master (e.g., a debug and test tool) to start up. In this idle state, all the devices (e.g., clients) are in a listening mode in one embodiment, for example, pure slave devices await a message on a broadcast address for a mastership announcement. In one embodiment, on startup, all the devices are in the idle state and wait for a selection from the master (e.g., master enable). A debug and test tool (for example, over the debug connector or one of the devices, e.g., through a physical connection or wireless access via a modem) may send out a request for mastership which (e.g., if no other master is already enabled) will (e.g., silently) be granted after a predefined collision detection wait time (CDWT), for example, a reject is only sent from an already enabled master. In one embodiment, if two devices request mastership at the same moment during the same idle phase (e.g., during the collision detection wait time) the conflict is detected (e.g., by the switching circuit) and both devices are to repeat the process after a random amount of interface cycles (e.g., greater than the CDWT and/or randomly chosen by the device(s) themselves). In one embodiment, after the conflict and the random wait period and once a device is able to capture the mastership, all other master contestants are to stop their initial master request. If one of these non-master devices still wants to gain mastership, it has to negotiate the request with the winning, now active master. During the topology detection, the master may assign a new addresses dynamically or obtain a static address set up. In the static case, the device addresses may be predefined and unique per device. For example, the addresses may be assigned via pin straps or set during production. In one embodiment, each device (e.g., a switching circuit of each device) includes hardware logic circuitry having a finite state machine operating according to flow schematic in FIG. 4.

Figure 5:
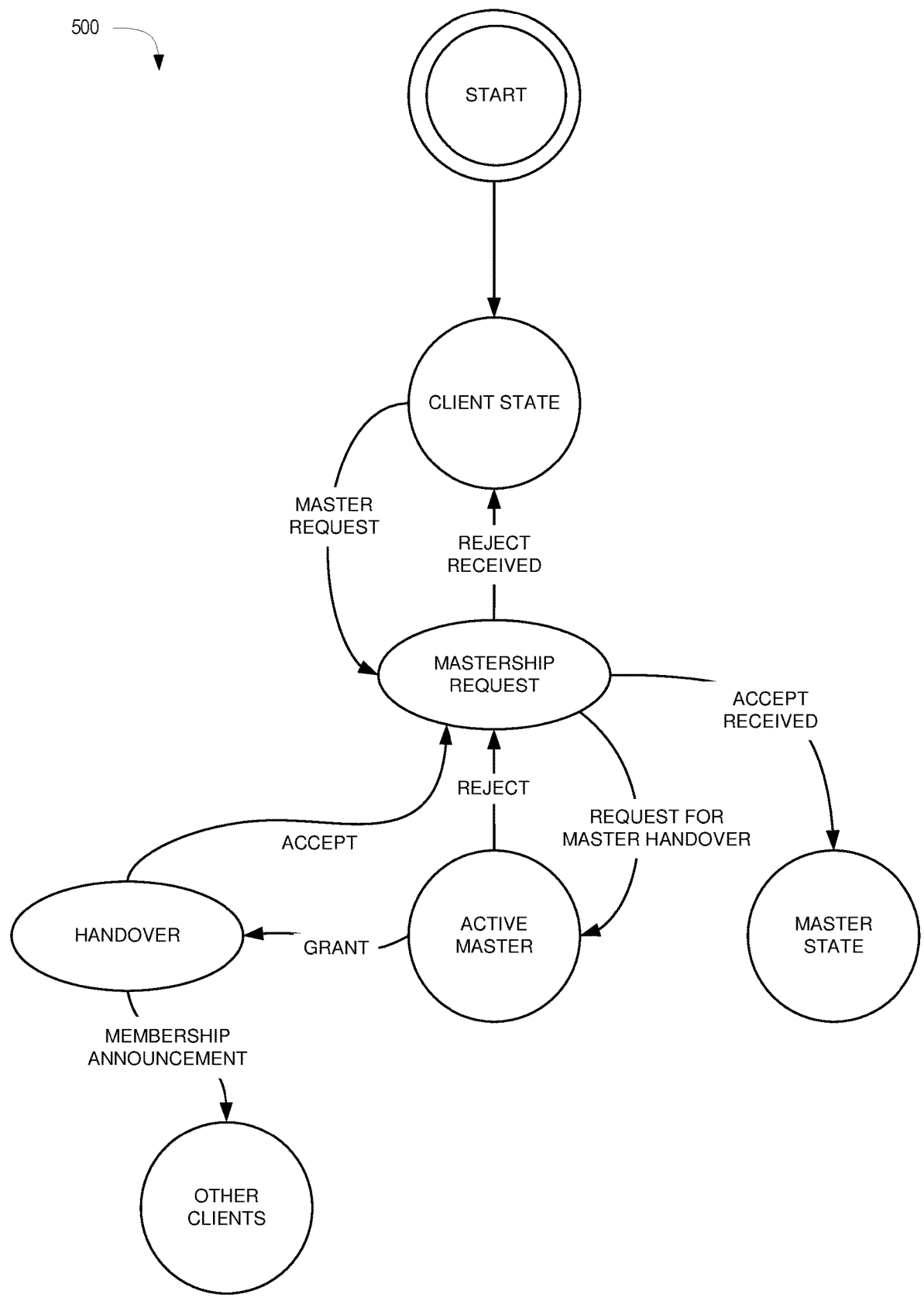
FIG. 5 illustrates flow schematic of a mastership handover according to embodiments of the disclosure.

FIG. 5 illustrates flow schematic of a mastership handover 500 (e.g., the hot switching of a mastership) according to embodiments of the disclosure. In certain embodiments, once the mastership is granted, no other device is allowed to send a direct request for the mastership, e.g., mastership is to be passed to the active master and granted by the active master. A device that is to become a new master may request mastership (e.g., from the switching circuit) from the active master, e.g. in a special field during a status read back. In one embodiment, once granted, the old master is to send out the mastership change as its last message, e.g., to indicate the hand-over from the old master to the new master. The broadcast of this mastership change may inform all slaves about the changed mastership. The flow in FIG. 5 may also be valid in cases where a second master is added (e.g., plugged) into the system (e.g., added intentionally or not). For example, this addition may happen during the master request of the first master or after the topology detection. In both of these embodiments, a direct mastership request is to lead to a rejection by the already active master, e.g., the new master needs to explicitly request a mastership handover.

The disclosure herein may also be utilized with bridge devices. A bridge device generally refers to a flexible device connected to two debug and test networks at the same time. Depending on the mastering in the system, these devices may be in a slave/master or a dual slave configuration. A bridge may be a dedicated circuit (e.g., an application-specific integrated circuit (ASIC) or a programmable device), which may have an additional role in the system (e.g., power controller). A master may access the main structures via bridges (e.g., slave to master role). In another embodiment, a bridge may firewall master accesses to a subnet already covered by another master and avoid the need to change mastership. In an embodiment where both connected subnets are covered by a master device, the bridge device may act as pure bridge and forward messages from one side to another. For both sides in such an embodiment, the bridge device is a client (e.g., slave to slave role). In one embodiment when one debug and test tool (e.g., DTS) is the sole master of all subnets, the bridge device is the master of the subnet not yet covered by a master. A master announcement in a subnet may lead to a role switch from master to slave. In certain embodiments, a bridge device shall not prohibit this, e.g., the default state of a bridge device is a passive master role. In one embodiment, the reason is that the devices (e.g., devices under test) only need to take care of their local addresses, e.g., they do not have or need knowledge of all devices in the debug and test topology. In one embodiment, a bridge device may be implemented in an existing component, e.g., via a service module. In one embodiment, each device (e.g., a switching circuit of each device) includes hardware logic circuitry having a finite state machine operating according to flow schematic in FIG. 5.

Figure 6B:
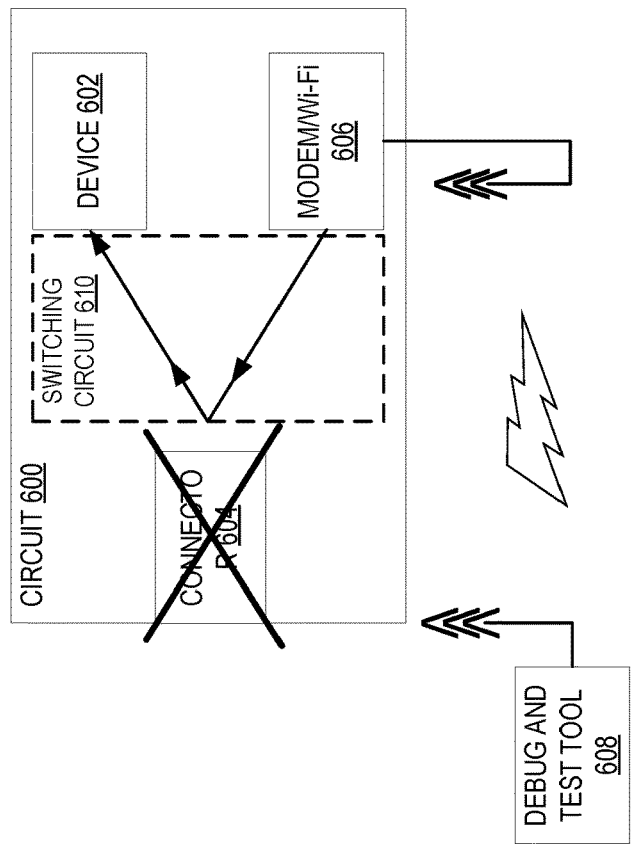
FIG. 6B illustrates the circuit of FIG. 6A with a wireless connection to the debug and test tool according to embodiments of the disclosure.
Figure 6A:
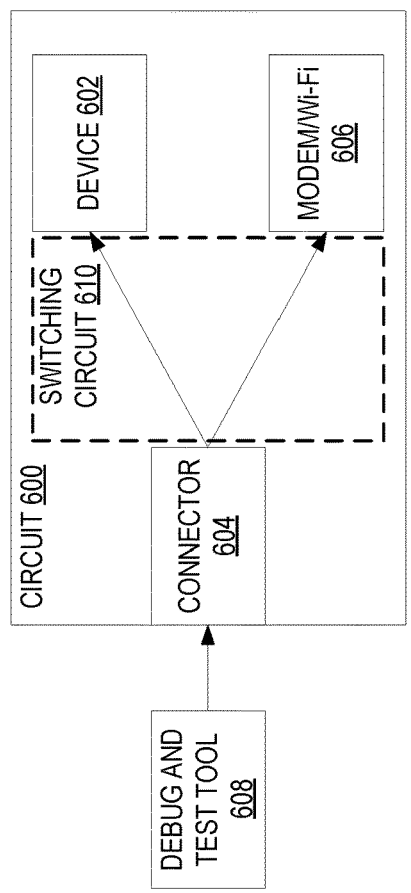
FIG. 6A illustrates a circuit connected with a physical connection to a debug and test tool according to embodiments of the disclosure.

FIG. 6A illustrates a circuit 600 connected with a physical connection (e.g. in a lab environment) to a debug and test tool according to embodiments of the disclosure. FIG. 6B illustrates the (e.g., field deployed) circuit 600 of FIG. 6A with a wireless connection to a debug and test tool according to embodiments of the disclosure.

In the embodiments in FIGS. 6A-6B, the device circuit (e.g., cores, etc.) are not depicted, e.g., the full function device is not depicted. In certain embodiments, the device 602 may be a set of devices, for example, the device 602 may be an application processor including several processing elements such as cores.

In the depicted embodiment in FIG. 6A, the debug and test tool 608 is connected to device 602 directly through the (e.g., physical) connector 604. In the depicted embodiment in FIG. 6B, the debug and test tool 608 is wirelessly connected to device 602 through the wireless connector (e.g., modem/Wi-Fi 606). For example, the wireless connector (e.g., components) may be the master, and the debug and test tool 608 may access the device circuit (e.g., cores, device 602, etc.) via the wireless connection. The cross-through depicted in FIG. 6B may be that the connector 604 is not included or it is disabled in FIG. 6B, e.g., but still the same set of wires is used.

In one embodiment of FIG. 6B, the debug and test tool 608 (e.g., hardware) is the sole master and accesses the device 602 (e.g., to the target device or system) directly. In one embodiment of FIG. 6B, the connector 604 (e.g., used before) may not be usable (e.g., due to mechanical construction, it may not be populated), or the target device or target system may not be physically located by the debug and test tool 608. In certain embodiments, the wireless connector (e.g., modem/Wi-Fi 606 device) is accessed by the debug and test tool 608 and this former pure client wireless connector device may claim mastership over the same wires as used before by the direct connection, e.g., via switching circuit 610. In certain embodiments, the debug and test capabilities are thus still available without redesigning the circuit (e.g., the printed circuit board).

In one embodiment, the wired connector 604 (e.g., via the debug and test tool) is a first device (e.g., a JTAG connector) requesting mastership and the other wireless connector (e.g., Modem/Wi-Fi 606) is a second device requesting mastership, e.g., according to the flow schematics discussed above.

In case of mass testing (e.g., for mean time between failure (MTBF) tests or manufacturing tests), bridge devices may be useful to ensure a beneficial throughput as they act as signal conditioners, e.g., cutting long connections and, in case the bridge devices are programmable elements, may be used to speed up the test time by offloading the debug and test operations from communication towards the client under test. For example, the main master may trigger a start of the test on each bridge device, which may be a master on the subnets. The bridge device may autonomously drive this test request to its connected clients, e.g., delivering only the results to the main master.

Figure 7:
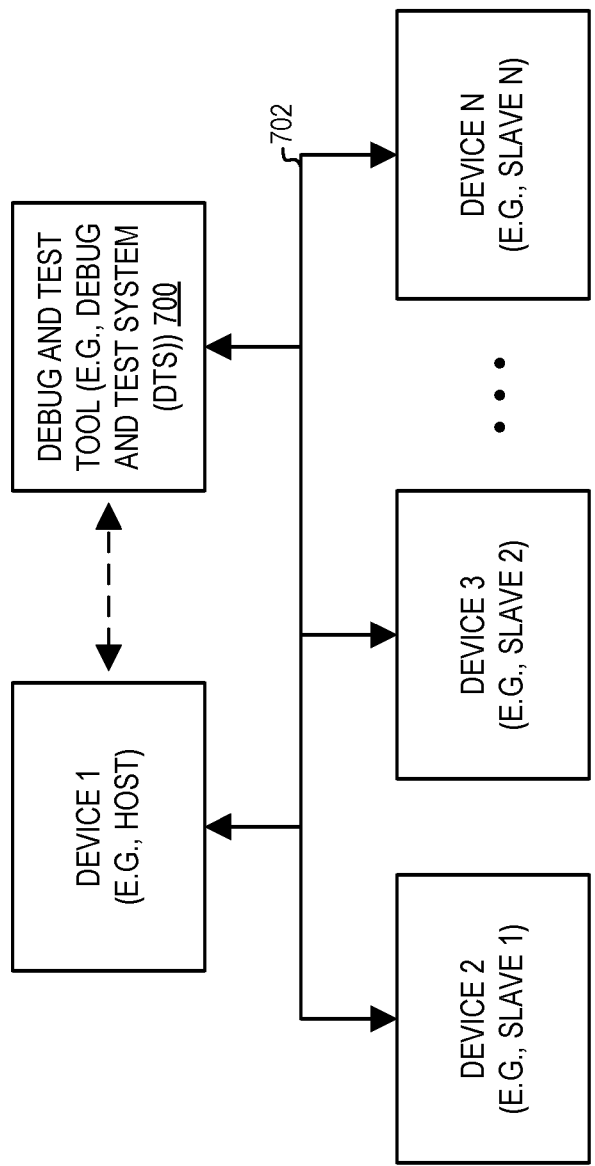
FIG. 7 illustrates a debug and test tool as a secondary master according to embodiments of the disclosure.

FIG. 7 illustrates a debug and test tool 700 as a secondary master according to embodiments of the disclosure. Debug and test tool 700 is coupled to bus 702, for example, via a connector according to a standard, e.g., an I3C standard or not an I3C standard. Device 1 (e.g., host) may initially (e.g., by default as a host) have a (e.g., test and debug) mastership. The debug and test tool 700 may request the mastership from device 1 (e.g., host), for example, according to the flow in FIG. 5. The dotted line indicates an optional, direct (e.g., point to point) connection between device 1 (e.g., host) and the debug and test tool 700. In one embodiment, the debug and test tool 700 is to take a secondary master role (e.g., only the debug and test mastership), for example, the debug and test tool 700 may hand over non-supported transfers to device 1 (e.g., main master), handle hot join of new slaves, handle other events (e.g., watchdog timer), or any combination thereof.

In one embodiment, when the debug and test tool 700 is attached (e.g., to bus 702 and/or device 1) is to use hot plug to attach to a debug and test network (e.g., via an I3C connector and/or system). The debug and test tool 700 may then query device 1 (e.g., the host) to determine if the (e.g., debug and test) mastership is swappable (e.g., exposed secondary master capability). The debug and test tool 700 may query one or more devices (for example, device 1 (e.g., the host)) to obtain a list of all of the slave devices, e.g., via main master (e.g., host), the define slaves (DEFSLVS) command code (e.g., common command codes (CCC) protocol), and/or sniffing after a reset.

One example of an access flow on a (e.g., user) debug request is: (1) a second device (e.g., debug and test tool 700) requests mastership on bus 702, (2) second device sends a debug mode (DBGMD) command code (e.g., CCC) to selected device that has the mastership (e.g., device 1 in FIG. 7), (3) second device executes debug session if slave(s) acknowledge DBGMD, (4) second device returns bus mastership to the device that had the mastership if an unsupported transfer was detected (e.g., debugged slaves may remain in debug state), and (5) exit debug state by sending DBGMD CCC (e.g., to address #0 of) a device (or debug) control register (e.g., of the second device) and return bus mastership (e.g., to device 1). FIGS. 8-10 depict embodiments of three variants in master setups.

FIG. 8 illustrates a debug and test system 800 with an adapter 802 as a secondary master according to embodiments of the disclosure. In one embodiment, adapter 802 is a hardware circuit that couples a (e.g., hardware) debug and test tool (e.g., controller) 804 to another device, e.g., to test and debug that another device. Depicted debug and test tool 804 couples to a driver (e.g., an I3C driver) which then couples to adapter 802 (e.g., an I3C adapter, for example, where adapter 802 functions as the secondary master (e.g., when coupled to a primary master).

FIG. 9 illustrates a debug and test system embedded on a product 900 (for example, a SoC, e.g., as disclosed herein)

as a secondary master according to embodiments of the disclosure. Master 902 (e.g., main master) (e.g., I3C master) couples to a driver (e.g., an I3C driver) which then couples to an operating system (OS) (e.g., running on a processor of product 900). OS is coupled to a debug application (e.g., to perform debug operations) (e.g., software) and other applications (e.g., to perform non-debug and/or non-test operations, for example, to perform logical or mathematical operations on input data). OS may arbitrate access to (e.g., I3C) debug application (e.g., software) to perform debug and test operations, e.g., to generate the debug command code(s).

FIG. 10 illustrates a system 1000 having a debug and test tool 1002 coupled to a master 1004 with a debug slave 1006 according to embodiments of the disclosure. Depicted debug and test tool 1002 is coupled (e.g., via I3C connector(s)) to a master 1004 (e.g., I3C master) and slave 1006 (e.g., I3C slave). The slave 1006 may assume the role of (e.g., debug and test) master, for example, on request of the debug and test tool 1002 to perform a debug and test operation. For example, a request by the debug and test tool 1002 to perform a debug and test operation may cause a debug command to be sent to the slave (e.g., which sets a debug enable bit in a device (or debug) control register) which then may cause the master 1004 to stall, e.g., to not perform the debug and test operations. Depicted slave 1006 couples to an adapter 1008, e.g., to translate commands between a first standard (e.g., I3C) and a second standard (e.g., JTAG). Adapter 1008 couples to debug and test access port (e.g., TAP 1010), which couples to a processor 1012 (e.g., a central processing unit (CPU)). Depicted master 1004 is coupled to a driver (for example, an I3C driver, e.g., to couple to a sensor), which is then coupled with an operating system (e.g., OS) which is coupled to application(s). Processor 1012 may execute one or more of the OS and application(s). Slave may be slave circuitry and the master may be master circuitry.

Figure 11:
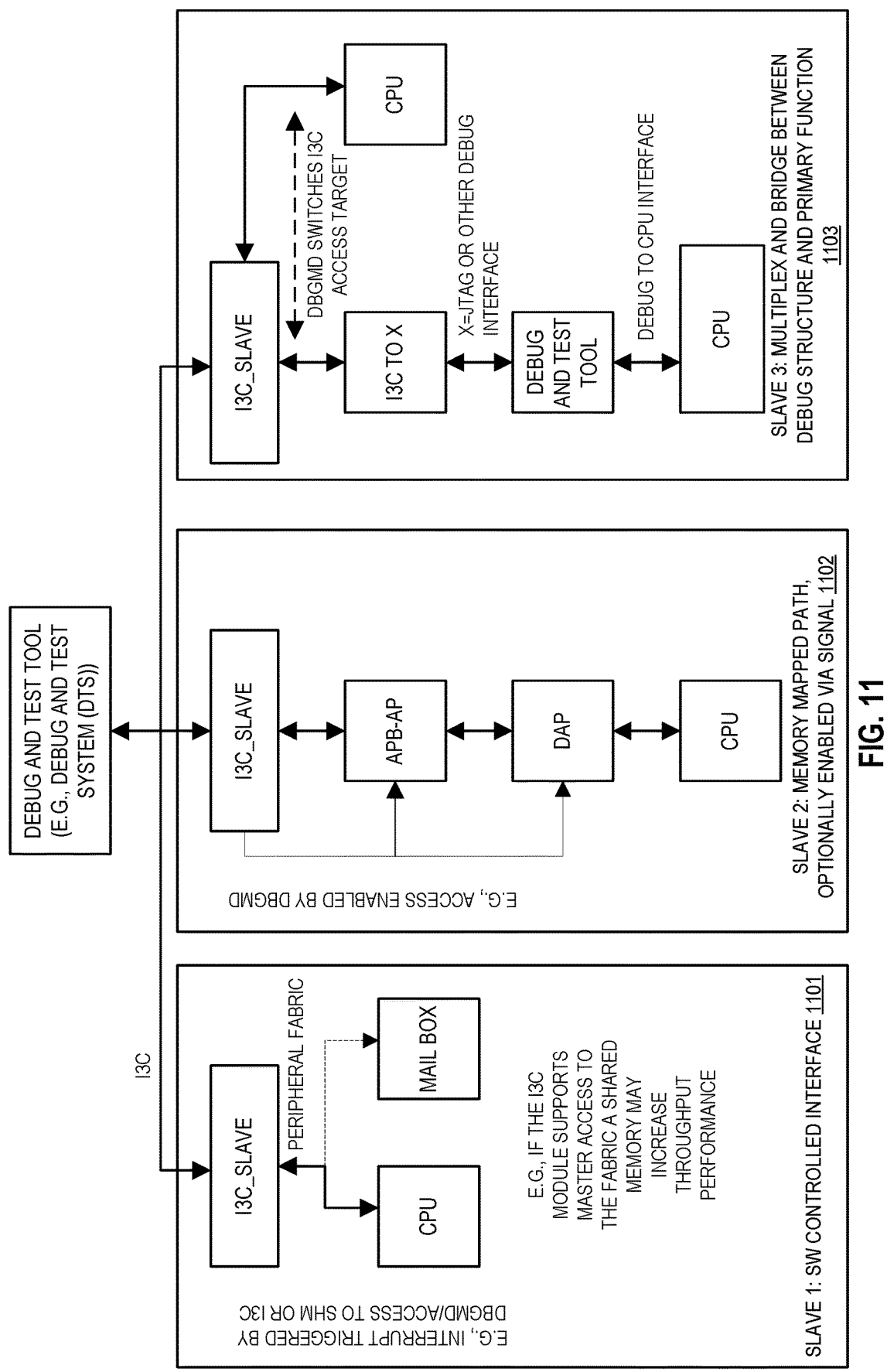
FIG. 11 illustrates three possible slave access configurations according to embodiments of the disclosure.

FIG. 11 illustrates three possible slave access configurations (1101, 1102, and 1103) according to embodiments of the disclosure. First configuration 1101 is a software controlled interface for the slave to a master. Second configuration 1102 is a memory mapped path, e.g., depicted in use with an advanced peripheral bus (APB). APB-AP may refer to an APB access port, e.g., of an ARM processor. DAP may refer to a debug access port, e.g., of an ARM processor. Third configuration 1103 is switched between a debug operation and non-debug operations. Although three slave access configurations are shown in FIG. 1, a single of those slave access configuration types may be used, e.g., for all slaves in a system.

Figure 12:
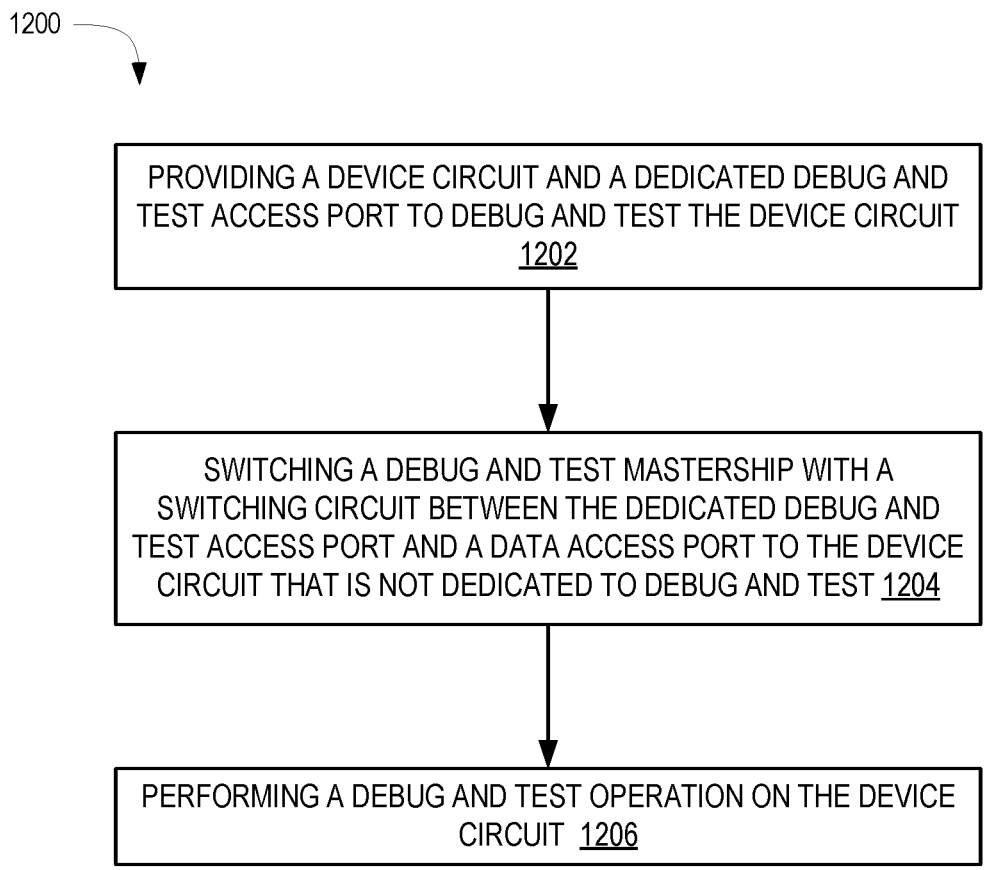
FIG. 12 illustrates a flow diagram according to embodiments of the disclosure.

FIG. 12 illustrates a flow diagram 1200 according to embodiments of the disclosure. Flow 1200 includes providing a device circuit and a dedicated debug and test access port to debug and test the device circuit 1202, switching a debug and test mastership (e.g., with a switching circuit) between the dedicated debug and test access port (e.g., physical and a data access port to the device circuit that is not dedicated to debug and test 1204, and performing a debug and test operation on the device circuit 1206.

In one embodiment, an apparatus includes a device circuit; a debug and test access port to debug and test the device circuit; and a switching circuit to switch a debug and test mastership between the (e.g., dedicated) debug and test access port and a data access port (e.g., of a serial bus) to the device circuit, wherein the data access port is not dedicated to debug and test. The switching circuit may provide the debug and test mastership to a first requestor of the debug and test access port and the data access port. The switching circuit may provide the debug and test mastership to one of the debug and test access port and the data access port and only transfer the debug and test mastership when granted by the switching circuit in response to a request for the debug and test mastership. The debug and test mastership may be acknowledged according to a Joint Test Action Group (JTAG) standard. The debug and test access port may be a physical connector to the device circuit and the data access port may be a wireless connector to the device circuit. The apparatus may further include a debug and test tool to wirelessly connect to the wireless connector. The debug and test tool may wirelessly connects through the wireless connector to a multiple pin Joint Test Action Group (JTAG) interface. The device circuit may further comprise an internal debug and test tool.

In another embodiment, a method may include providing a device circuit and a debug and test access port to debug and test the device circuit; switching a debug and test mastership with a switching circuit between the debug and test access port and a data access port to the device circuit that is not dedicated to debug and test; and performing a debug and test operation on the device circuit. The method may include providing the debug and test mastership to a first requestor of the debug and test access port and the data access port. The method may include providing the debug and test mastership to one of the debug and test access port and the data access port, and only transferring the debug and test mastership when granted by the switching circuit in response to a request for the debug and test mastership. The method may include acknowledging the debug and test mastership according to a Joint Test Action Group (JTAG) standard. The method may include providing the debug and test access port as a physical connector to the device circuit and the data access port as a wireless connector to the device circuit. The method may include wirelessly connecting a debug and test tool to the wireless connector. The wirelessly connecting may include wirelessly connecting the debug and test tool through the wireless connector to a multiple pin Joint Test Action Group (JTAG) interface. The providing may include providing the device circuit having an internal debug and test tool.

In yet another embodiment, a computing system includes a plurality of devices; a debug network coupled between the plurality of devices and dedicated to debug and test, wherein each of the plurality of devices comprises an internal test and debug tool, and a debug and test access port coupled to the debug network; and a switching circuit to switch a debug and test mastership between: an internal test and debug tool of a first device of the plurality of devices and couple the internal test and debug tool of the first device to all other devices of the plurality of devices through the debug and test access port of the first device, and an internal test and debug tool of a second device of the plurality of devices and couple the internal test and debug tool of the second device to all other devices of the plurality of devices through the debug and test access port of the second device. The plurality of devices may include at least three devices, and the switching circuit may further switch the debug and test mastership between an internal test and debug tool of a third device of the plurality of devices and couple the internal test and debug tool of the third device to all other devices of the plurality of devices through the debug and test access port of the third device. When the switching circuit switches the debug and test mastership to an internal test and debug tool of a device of the plurality of devices, the switching circuit may disconnect an internal test and debug tool of each of the other devices from the debug network. The switching circuit may provide the debug and test mastership to a first requesting device of the plurality of devices. The switching circuit may provide the debug and test mastership to one of the plurality of devices and only transfer the debug and test mastership when granted by the switching circuit in response to a request for the debug and test mastership. The debug and test mastership may be acknowledged according to a Joint Test Action Group (JTAG) standard. The debug network may be a multiple pin Joint Test Action Group (JTAG) interface. The switching circuit may further switch each device of the plurality of devices between a first mode where an internal debug and test tool of a device is connected to all other devices of the plurality of devices through a debug and test access port of the device, and a second mode where the internal debug and test tool of the device is not connected to any other device of the plurality of devices through the debug and test access port of the device.

In another embodiment, an apparatus includes a device circuit; a debug and test access port to debug and test the device circuit; and means to switch a debug and test mastership between the debug and test access port and a data access port to the device circuit that is not dedicated to debug and test.

In yet another embodiment, a computing system includes a plurality of devices; a debug network coupled between the plurality of devices and dedicated to debug and test, wherein each of the plurality of devices comprises an internal test and debug tool, and a debug and test access port coupled to the debug network; and means to switch a debug and test mastership between: an internal test and debug tool of a first device of the plurality of devices and couple the internal test and debug tool of the first device to all other devices of the plurality of devices through the debug and test access port of the first device, and an internal test and debug tool of a second device of the plurality of devices and couple the internal test and debug tool of the second device to all other devices of the plurality of devices through the debug and test access port of the second device.

In another embodiment, an apparatus comprises a data storage device that stores code that when executed by a hardware processor causes the hardware processor to perform any method disclosed herein. An apparatus may be as described in the detailed description. A method may be as described in the detailed description.

In yet another embodiment, a non-transitory machine readable medium that stores code that when executed by a machine causes the machine to perform a method comprising any method disclosed herein.

Certain embodiments herein may be utilized with any computing or debug-able system, device, or platform. Certain embodiments herein may be utilized with the internet of things (IoT). Certain embodiments herein may be utilized with a data center (e.g., a server including a plurality of hardware devices). Certain embodiments herein may provide one or more of: closed chassis debug, debug interface, debug network, design for debug, mass testing, and a multiple master. Certain embodiments herein may be utilized by any device or combination of devices needing a debug interface which is capable to support (e.g., switch between) multiple debug masters. This may include IoTs, modems, and datacenters. A data center may include one or more processors with one or more cores, e.g., that execute instructions from an instruction set.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, April 2016; and see Intel® Architecture Instruction Set Extensions Programming Reference, February 2016).

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 13A is a block diagram illustrating both an exemplary in-order pipeline and an exemplary register renaming, out-of-order issue/execution pipeline according to embodiments of the disclosure. FIG. 13B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 13A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 13A, a processor pipeline 1300 includes a fetch stage 1302, a length decode stage 1304, a decode stage 1306, an allocation stage 1308, a renaming stage 1310, a scheduling (also known as a dispatch or issue) stage 1312, a register read/memory read stage 1314, an execute stage 1316, a write back/memory write stage 1318, an exception handling stage 1322, and a commit stage 1324.

FIG. 13B shows processor core 1390 including a front end unit 1330 coupled to an execution engine unit 1350, and both are coupled to a memory unit 1370. The core 1390 may be a reduced instruction set computing (RISC) core, a complex instruction set computing (CISC) core, a very long instruction word (VLIW) core, or a hybrid or alternative core type. As yet another option, the core 1390 may be a special-purpose core, such as, for example, a network or communication core, compression engine, coprocessor core, general purpose computing graphics processing unit (GPGPU) core, graphics core, or the like.

The front end unit 1330 includes a branch prediction unit 1332 coupled to an instruction cache unit 1334, which is coupled to an instruction translation lookaside buffer (TLB) 1336, which is coupled to an instruction fetch unit 1338, which is coupled to a decode unit 1340. The decode unit 1340 (or decoder or decoder unit) may decode instructions (e.g., macro-instructions), and generate as an output one or more micro-operations, micro-code entry points, micro-instructions, other instructions, or other control signals, which are decoded from, or which otherwise reflect, or are derived from, the original instructions. The decode unit 1340 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1390 includes a microcode ROM or other medium that stores microcode for certain macroinstructions (e.g., in decode unit 1340 or otherwise within the front end unit 1330). The decode unit 1340 is coupled to a rename/allocator unit 1352 in the execution engine unit 1350.

The execution engine unit 1350 includes the rename/allocator unit 1352 coupled to a retirement unit 1354 and a set of one or more scheduler unit(s) 1356. The scheduler unit(s) 1356 represents any number of different schedulers, including reservations stations, central instruction window, etc. The scheduler unit(s) 1356 is coupled to the physical register file(s) unit(s) 1358. Each of the physical register file(s) units 1358 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1358 comprises a vector registers unit, a write mask registers unit, and a scalar registers unit. These register units may provide architectural vector registers, vector mask registers, and general purpose registers. The physical register file(s) unit(s) 1358 is overlapped by the retirement unit 1354 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1354 and the physical register file(s) unit(s) 1358 are coupled to the execution cluster(s) 1360. The execution cluster(s) 1360 includes a set of one or more execution units 1362 and a set of one or more memory access units 1364. The execution units 1362 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1356, physical register file(s) unit(s) 1358, and execution cluster(s) 1360 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1364). It should also be understood that where separate pipelines are used, one or more of these pipelines may be out-of-order issue/execution and the rest in-order.

The set of memory access units 1364 is coupled to the memory unit 1370, which includes a data TLB unit 1372 coupled to a data cache unit 1374 coupled to a level 2 (L2) cache unit 1376. In one exemplary embodiment, the memory access units 1364 may include a load unit, a store address unit, and a store data unit, each of which is coupled to the data TLB unit 1372 in the memory unit 1370. The instruction cache unit 1334 is further coupled to a level 2 (L2) cache unit 1376 in the memory unit 1370. The L2 cache unit 1376 is coupled to one or more other levels of cache and eventually to a main memory.

By way of example, the exemplary register renaming, out-of-order issue/execution core architecture may implement the pipeline 1300 as follows: 1) the instruction fetch 1338 performs the fetch and length decoding stages 1302 and 1304; 2) the decode unit 1340 performs the decode stage 1306; 3) the rename/allocator unit 1352 performs the allocation stage 1308 and renaming stage 1310; 4) the scheduler unit(s) 1356 performs the schedule stage 1312; 5) the physical register file(s) unit(s) 1358 and the memory unit 1370 perform the register read/memory read stage 1314; the execution cluster 1360 perform the execute stage 1316; 6) the memory unit 1370 and the physical register file(s) unit(s) 1358 perform the write back/memory write stage 1318; 7) various units may be involved in the exception handling stage 1322; and 8) the retirement unit 1354 and the physical register file(s) unit(s) 1358 perform the commit stage 1324.

The core 1390 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1390 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1334/1374 and a shared L2 cache unit 1376, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 14B:
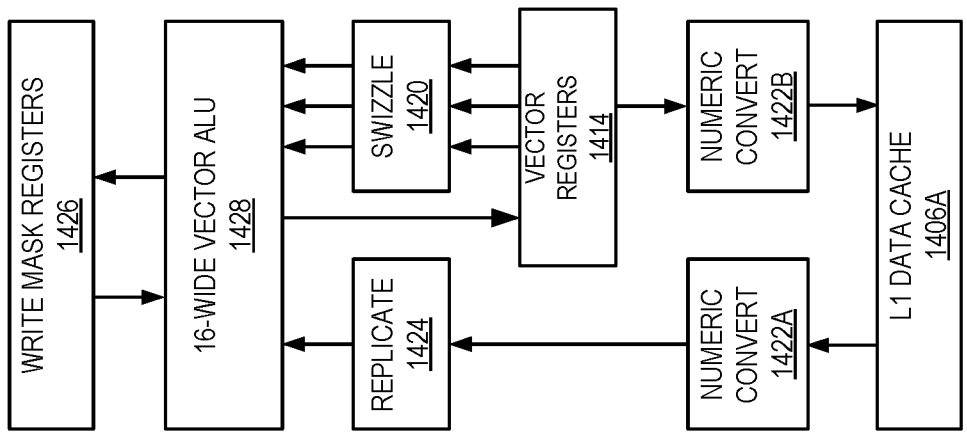
FIG. 14B is an expanded view of part of the processor core in FIG. 14A according to embodiments of the disclosure.
Figure 14A:
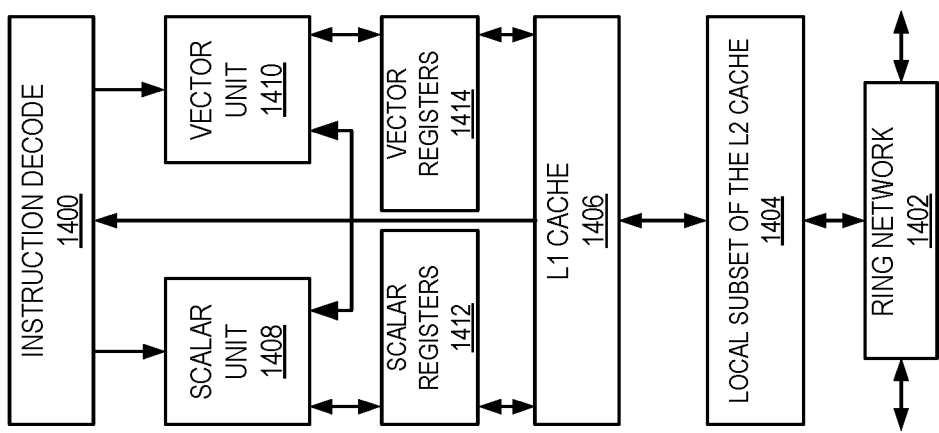
FIG. 14A is a block diagram of a single processor core, along with its connection to the on-die interconnect network and with its local subset of the Level 2 (L2) cache, according to embodiments of the disclosure.

FIGS. 14A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 14A is a block diagram of a single processor core, along with its connection to the on-die interconnect network 1402 and with its local subset of the Level 2 (L2) cache 1404, according to embodiments of the disclosure. In one embodiment, an instruction decode unit 1400 supports the x86 instruction set with a packed data instruction set extension. An L1 cache 1406 allows low-latency accesses to cache memory into the scalar and vector units. While in one embodiment (to simplify the design), a scalar unit 1408 and a vector unit 1410 use separate register sets (respectively, scalar registers 1412 and vector registers 1414) and data transferred between them is written to memory and then read back in from a level 1 (L1) cache 1406, alternative embodiments of the disclosure may use a different approach (e.g., use a single register set or include a communication path that allow data to be transferred between the two register files without being written and read back).

The local subset of the L2 cache 1404 is part of a global L2 cache that is divided into separate local subsets, one per processor core. Each processor core has a direct access path to its own local subset of the L2 cache 1404. Data read by a processor core is stored in its L2 cache subset 1404 and can be accessed quickly, in parallel with other processor cores accessing their own local L2 cache subsets. Data written by a processor core is stored in its own L2 cache subset 1404 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 14B is an expanded view of part of the processor core in FIG. 14A according to embodiments of the disclosure. FIG. 14B includes an L1 data cache 1406A part of the L1 cache 1404, as well as more detail regarding the vector unit 1410 and the vector registers 1414. Specifically, the vector unit 1410 is a 16-wide vector processing unit (VPU) (see the 16-wide ALU 1428), which executes one or more of integer, single-precision float, and double-precision float instructions. The VPU supports swizzling the register inputs with swizzle unit 1420, numeric conversion with numeric convert units 1422A-B, and replication with replication unit 1424 on the memory input. Write mask registers 1426 allow predicating resulting vector writes.

Figure 15:
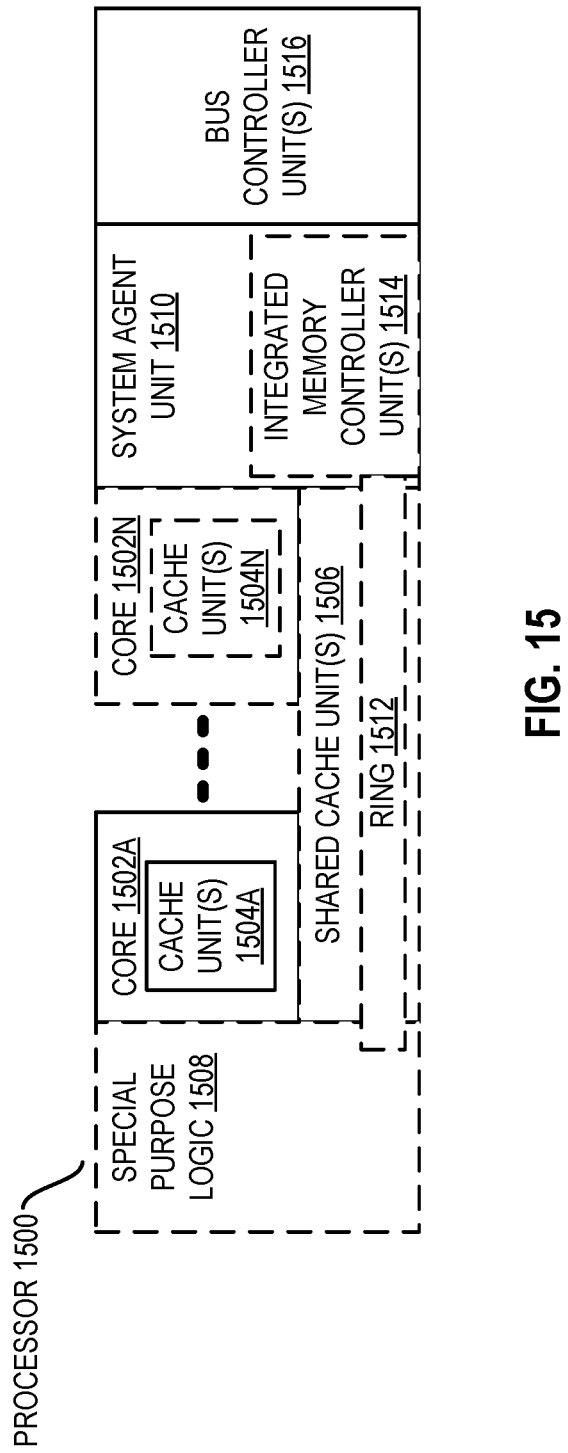
FIG. 15 is a block diagram of a processor that may have more than one core, may have an integrated memory controller, and may have integrated graphics according to embodiments of the disclosure.

FIG. 15 is a block diagram of a processor 1500 that may have more than one core, may have an integrated memory controller, and may have integrated graphics according to embodiments of the disclosure. The solid lined boxes in FIG. 15 illustrate a processor 1500 with a single core 1502A, a system agent 1510, a set of one or more bus controller units 1516, while the optional addition of the dashed lined boxes illustrates an alternative processor 1500 with multiple cores 1502A-N, a set of one or more integrated memory controller unit(s) 1514 in the system agent unit 1510, and special purpose logic 1508.

Thus, different implementations of the processor 1500 may include: 1) a CPU with the special purpose logic 1508 being integrated graphics and/or scientific (throughput) logic (which may include one or more cores), and the cores 1502A-N being one or more general purpose cores (e.g., general purpose in-order cores, general purpose out-of-order cores, a combination of the two); 2) a coprocessor with the cores 1502A-N being a large number of special purpose cores intended primarily for graphics and/or scientific (throughput); and 3) a coprocessor with the cores 1502A-N being a large number of general purpose in-order cores. Thus, the processor 1500 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1500 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1506, and external memory (not shown) coupled to the set of integrated memory controller units 1514. The set of shared cache units 1506 may include one or more mid-level caches, such as level 2 (L2), level 3 (L3), level 4 (L4), or other levels of cache, a last level cache (LLC), and/or combinations thereof. While in one embodiment a ring based interconnect unit 1512 interconnects the integrated graphics logic 1508, the set of shared cache units 1506, and the system agent unit 1510/integrated memory controller unit(s) 1514, alternative embodiments may use any number of well-known techniques for interconnecting such units. In one embodiment, coherency is maintained between one or more cache units 1506 and cores 1502-A-N.

In some embodiments, one or more of the cores 1502A-N are capable of multi-threading. The system agent 1510 includes those components coordinating and operating cores 1502A-N. The system agent unit 1510 may include for example a power control unit (PCU) and a display unit. The PCU may be or include logic and components needed for regulating the power state of the cores 1502A-N and the integrated graphics logic 1508. The display unit is for driving one or more externally connected displays.

The cores 1502A-N may be homogenous or heterogeneous in terms of architecture instruction set; that is, two or more of the cores 1502A-N may be capable of execution the same instruction set, while others may be capable of executing only a subset of that instruction set or a different instruction set.

Exemplary Computer Architectures

FIGS. 16-19 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 16:
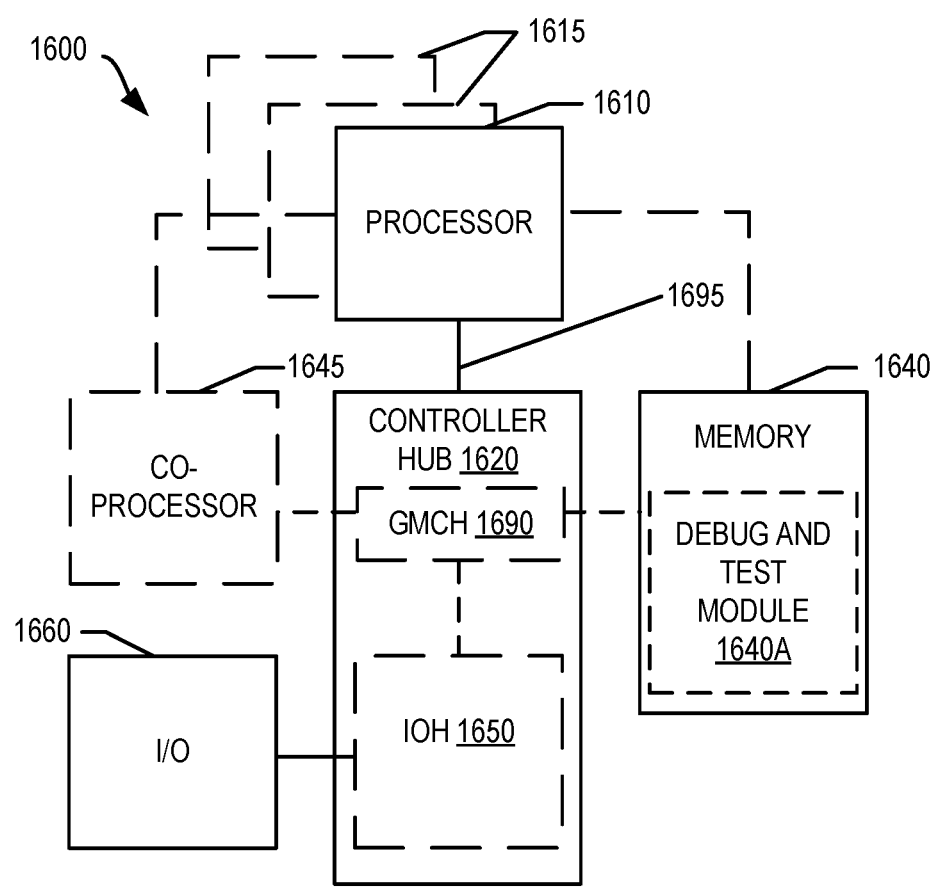
FIG. 16 is a block diagram of a system in accordance with one embodiment of the present disclosure.

Referring now to FIG. 16, shown is a block diagram of a system 1600 in accordance with one embodiment of the present disclosure. The system 1600 may include one or more processors 1610, 1615, which are coupled to a controller hub 1620. In one embodiment the controller hub 1620 includes a graphics memory controller hub (GMCH) 1690 and an Input/Output Hub (IOH) 1650 (which may be on separate chips); the GMCH 1690 includes memory and graphics controllers to which are coupled memory 1640 and a coprocessor 1645; the IOH 1650 is couples input/output (I/O) devices 1660 to the GMCH 1690, e.g., via a data access port. Alternatively, one or both of the memory and graphics controllers are integrated within the processor (as described herein), the memory 1640 and the coprocessor 1645 are coupled directly to the processor 1610, and the controller hub 1620 in a single chip with the IOH 1650. Memory 1640 may include a debug and test module 1640A, for example, to store code that when executed causes a processor to perform any method of this disclosure.

The optional nature of additional processors 1615 is denoted in FIG. 16 with broken lines. Each processor 1610, 1615 may include one or more of the processing cores described herein and may be some version of the processor 1500.

The memory 1640 may be, for example, dynamic random access memory (DRAM), phase change memory (PCM), or a combination of the two. For at least one embodiment, the controller hub 1620 communicates with the processor(s) 1610, 1615 via a multi-drop bus, such as a frontside bus (FSB), point-to-point interface such as QuickPath Interconnect (QPI), or similar connection 1695.

In one embodiment, the coprocessor 1645 is a special-purpose processor, such as, for example, a high-throughput MIC processor, a network or communication processor, compression engine, graphics processor, GPGPU, embedded processor, or the like. In one embodiment, controller hub 1620 may include an integrated graphics accelerator.

There can be a variety of differences between the physical resources 1610, 1615 in terms of a spectrum of metrics of merit including architectural, microarchitectural, thermal, power consumption characteristics, and the like.

In one embodiment, the processor 1610 executes instructions that control data processing operations of a general type. Embedded within the instructions may be coprocessor instructions. The processor 1610 recognizes these coprocessor instructions as being of a type that should be executed by the attached coprocessor 1645. Accordingly, the processor 1610 issues these coprocessor instructions (or control signals representing coprocessor instructions) on a coprocessor bus or other interconnect, to coprocessor 1645. Coprocessor (s) 1645 accept and execute the received coprocessor instructions.

Figure 17:
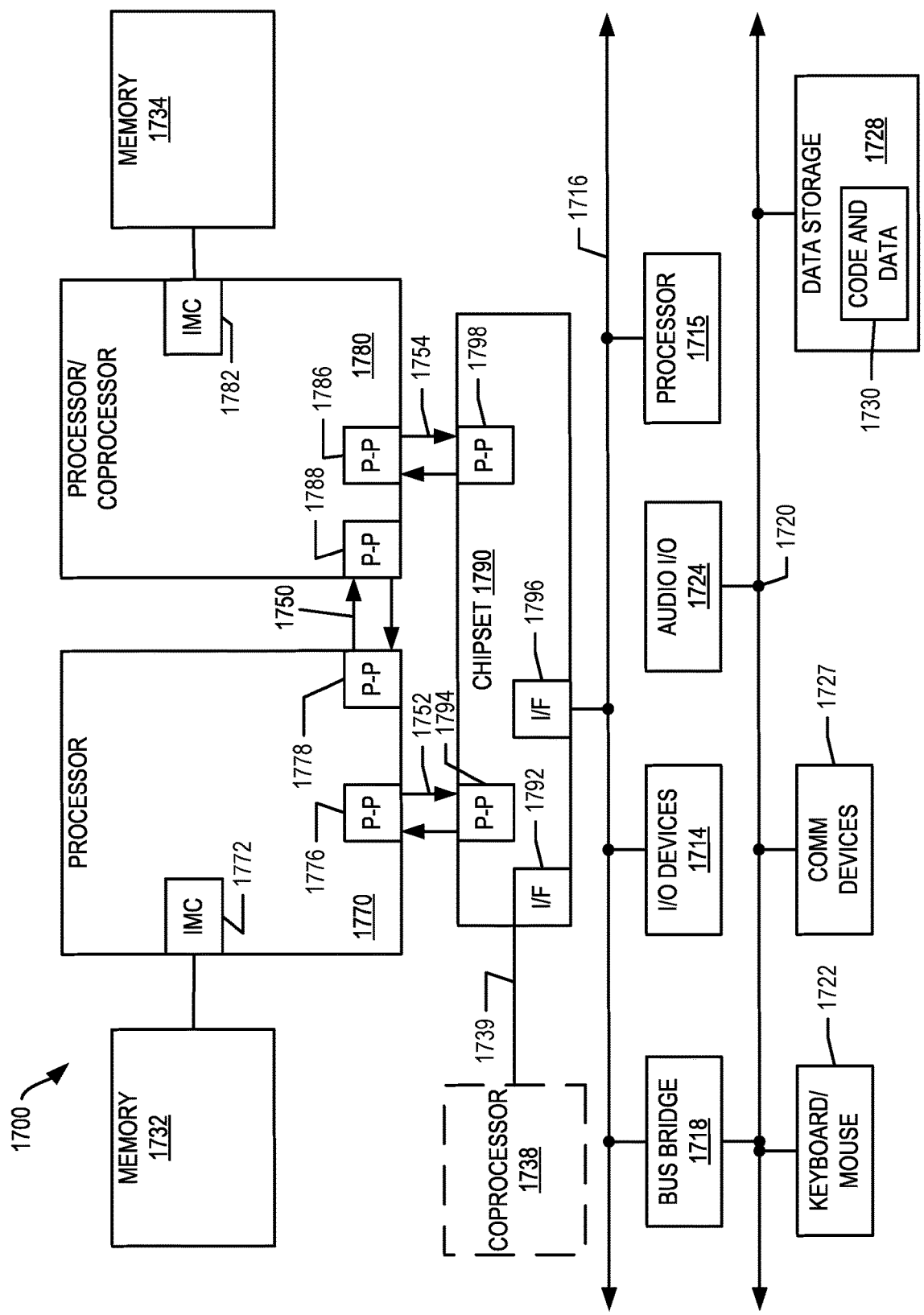
FIG. 17 is a block diagram of a more specific exemplary system in accordance with an embodiment of the present disclosure.

Referring now to FIG. 17, shown is a block diagram of a first more specific exemplary system 1700 in accordance with an embodiment of the present disclosure. As shown in FIG. 17, multiprocessor system 1700 is a point-to-point interconnect system, and includes a first processor 1770 and a second processor 1780 coupled via a point-to-point interconnect 1750. Each of processors 1770 and 1780 may be some version of the processor 1500. In one embodiment of the disclosure, processors 1770 and 1780 are respectively processors 1610 and 1615, while coprocessor 1738 is coprocessor 1645. In another embodiment, processors 1770 and 1780 are respectively processor 1610 coprocessor 1645.

Processors 1770 and 1780 are shown including integrated memory controller (IMC) units 1772 and 1782, respectively. Processor 1770 also includes as part of its bus controller units point-to-point (P-P) interfaces 1776 and 1778; similarly, second processor 1780 includes P-P interfaces 1786 and 1788. Processors 1770, 1780 may exchange information via a point-to-point (P-P) interface 1750 using P-P interface circuits 1778, 1788. As shown in FIG. 17, IMCs 1772 and 1782 couple the processors to respective memories, namely a memory 1732 and a memory 1734, which may be portions of main memory locally attached to the respective processors.

Processors 1770, 1780 may each exchange information with a chipset 1790 via individual P-P interfaces 1752, 1754 using point to point interface circuits 1776, 1794, 1786, 1798. Chipset 1790 may optionally exchange information with the coprocessor 1738 via a high-performance interface 1739. In one embodiment, the coprocessor 1738 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1790 may be coupled to a first bus 1716 via an interface 1796. In one embodiment, first bus 1716 may be a Peripheral Component Interconnect (PCI) bus, or a bus such as a PCI Express bus or another third generation I/O interconnect bus, although the scope of the present disclosure is not so limited.

As shown in FIG. 17, various I/O devices 1714 may be coupled (e.g., via a data access port) to first bus 1716, along with a bus bridge 1718 which couples first bus 1716 to a second bus 1720. In one embodiment, one or more additional processor(s) 1715, such as coprocessors, high-throughput MIC processors, GPGPU's, accelerators (such as, e.g., graphics accelerators or digital signal processing (DSP) units), field programmable gate arrays, or any other processor, are coupled to first bus 1716. In one embodiment, second bus 1720 may be a low pin count (LPC) bus. Various devices may be coupled to a second bus 1720 including, for example, a keyboard and/or mouse 1722, communication devices 1727 and a storage unit 1728 such as a disk drive or other mass storage device which may include instructions/ code and data 1730, in one embodiment. Further, an audio I/O 1724 may be coupled to the second bus 1720. Note that other architectures are possible. For example, instead of the point-to-point architecture of FIG. 17, a system may implement a multi-drop bus or other such architecture.

Figure 18:
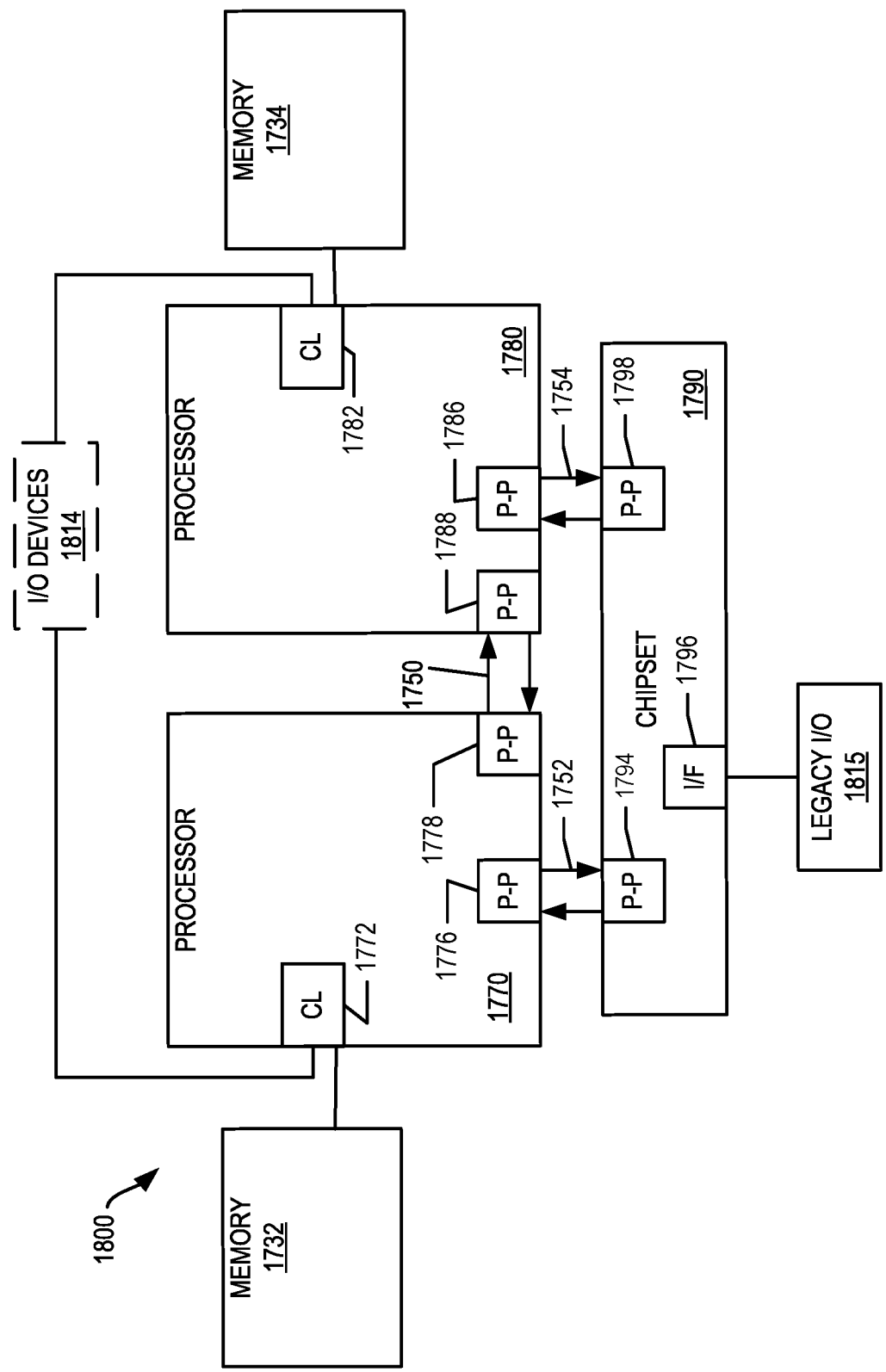
FIG. 18, shown is a block diagram of a second more specific exemplary system in accordance with an embodiment of the present disclosure.

Referring now to FIG. 18, shown is a block diagram of a second more specific exemplary system 1800 in accordance with an embodiment of the present disclosure Like elements in FIGS. 17 and 18 bear like reference numerals, and certain aspects of FIG. 17 have been omitted from FIG. 18 in order to avoid obscuring other aspects of FIG. 18.

FIG. 18 illustrates that the processors 1770, 1780 may include integrated memory and I/O control logic ("CL") 1772 and 1782, respectively. Thus, the CL 1772, 1782 include integrated memory controller units and include I/O control logic. FIG. 18 illustrates that not only are the memories 1732, 1734 coupled to the CL 1772, 1782, but also that I/O devices 1814 are also coupled (e.g., via data access port (depicted as the line coupled to I/O devices 1814)) to the control logic 1772, 1782. Legacy I/O devices 1815 are coupled (e.g., via a data access port) to the chipset 1790.

Figure 19:
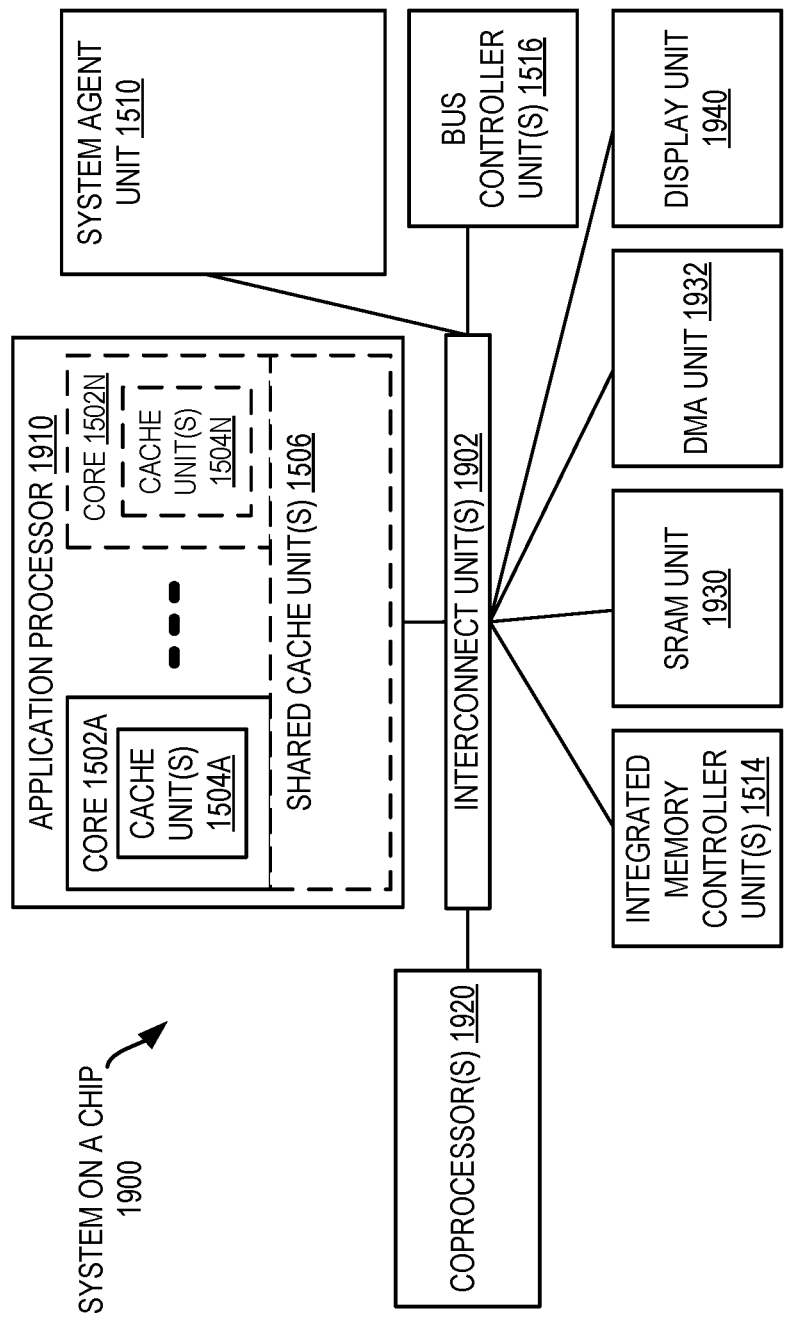
FIG. 19, shown is a block diagram of a system on a chip (SoC) in accordance with an embodiment of the present disclosure.

Referring now to FIG. 19, shown is a block diagram of a SoC 1900 in accordance with an embodiment of the present disclosure. Similar elements in FIG. 15 bear like reference numerals. Also, dashed lined boxes are optional features on more advanced SoCs. In FIG. 19, an interconnect unit(s) 1902 is coupled to: an application processor 1910 which includes a set of one or more cores 1502A-N and shared cache unit(s) 1506; a system agent unit 1510; a bus controller unit(s) 1516; an integrated memory controller unit(s) 1514; a set or one or more coprocessors 1920 which may include integrated graphics logic, an image processor, an audio processor, and a video processor; an static random access memory (SRAM) unit 1930; a direct memory access (DMA) unit 1932; and a display unit 1940 for coupling to one or more external displays. In one embodiment, the coprocessor(s) 1920 include a special-purpose processor, such as, for example, a network or communication processor, compression engine, GPGPU, a high-throughput MIC processor, embedded processor, or the like.

Embodiments (e.g., of the mechanisms) disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 1730 illustrated in FIG. 17, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the disclosure also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 20:
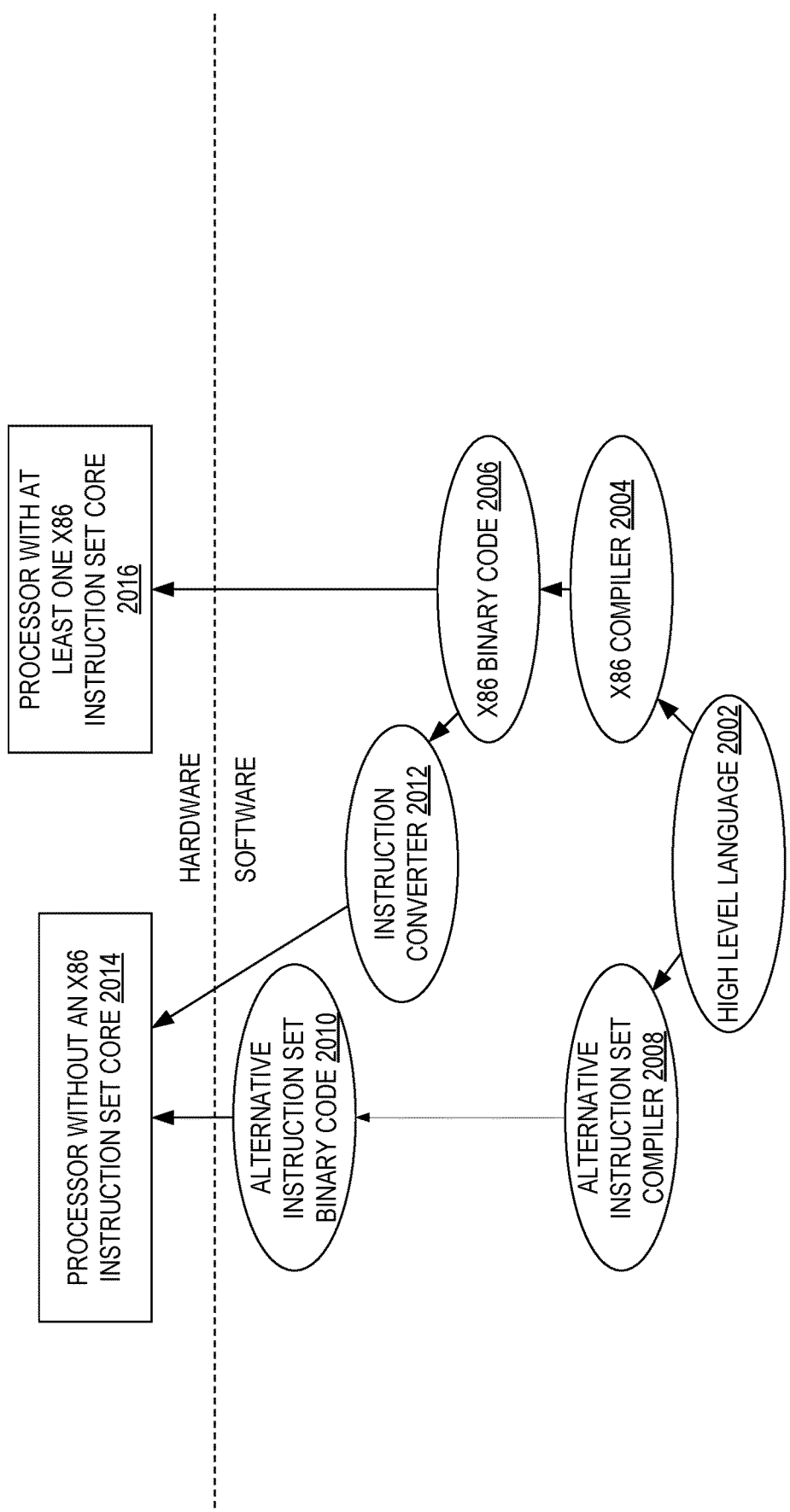
FIG. 20 is a block diagram contrasting the use of a software instruction converter to convert binary instructions in a source instruction set to binary instructions in a target instruction set according to embodiments of the disclosure.

FIG. 20 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 20 shows a program in a high level language 2002 may be compiled using an x86 compiler 2004 to generate x86 binary code 2006 that may be natively executed by a processor with at least one x86 instruction set core 2016. The processor with at least one x86 instruction set core 2016 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 2004 represents a compiler that is operable to generate x86 binary code 2006 (e.g., object code) that can, with or without additional linkage processing, be executed on the processor with at least one x86 instruction set core 2016. Similarly, FIG. 20 shows the program in the high level language 2002 may be compiled using an alternative instruction set compiler 2008 to generate alternative instruction set binary code 2010 that may be natively executed by a processor without at least one x86 instruction set core 2014 (e.g., a processor with cores that execute the MIPS instruction set of MIPS Technologies of Sunnyvale, Calif. and/or that execute the ARM instruction set of ARM Holdings of Sunnyvale, Calif.). The instruction converter 2012 is used to convert the x86 binary code 2006 into code that may be natively executed by the processor without an x86 instruction set core 2014. This converted code is not likely to be the same as the alternative instruction set binary code 2010 because an instruction converter capable of this is difficult to make; however, the converted code will accomplish the general operation and be made up of instructions from the alternative instruction set. Thus, the instruction converter 2012 represents software, firmware, hardware, or a combination thereof that, through emulation, simulation or any other process, allows a processor or other electronic device that does not have an x86 instruction set processor or core to execute the x86 binary code 2006.

What is claimed is:

1. An apparatus comprising:
   a device circuit;
   a wireless connector circuit; and
   a switching circuit coupled between the device circuit and the wireless connector circuit to switch a debug and test control from the wireless connector circuit to a debug and test tool, wirelessly connected to the wireless connector circuit, to perform a debug and test operation on the device circuit.

2. The apparatus of claim 1, wherein the switching circuit is to switch the debug and test control to the debug and test tool to further perform a debug and test operation on the wireless connector circuit.

3. The apparatus of claim 1, wherein the switch of the debug and test control comprises a stall of the wireless connector circuit as a primary controller.

4. The apparatus of claim 3, wherein a request by the debug and test tool to perform the debug and test operation causes the stall of the wireless connector circuit as the primary controller.

5. The apparatus of claim 1, wherein the debug and test control is acknowledged according to a bus standard.

6. The apparatus of claim 1, wherein the debug and test control is a sole control when switched to the debug and test tool.

7. The apparatus of claim 1, wherein the debug and test tool wirelessly connects through the wireless connector circuit to a multiple pin Joint Test Action Group (JTAG) interface.

8. The apparatus of claim 1, wherein the device circuit further comprises an internal debug and test tool.

9. A method comprising:
   wirelessly connecting a debug and test tool to a wireless connector circuit;
   switching a debug and test control, with a switching circuit coupled between a device circuit and the wireless connector circuit, from the wireless connector circuit to the debug and test tool wirelessly connected to the wireless connector circuit; and
   performing a debug and test operation on the device circuit with the debug and test tool having the debug and test control.

10. The method of claim 9, further comprising performing a debug and test operation on the wireless connector circuit with the debug and test tool having the debug and test control.

11. The method of claim 9, wherein the switching of the debug and test control comprises stalling the wireless connector circuit as a primary controller.

12. The method of claim 11, wherein sending a request by the debug and test tool to perform the debug and test operation causes the stalling of the wireless connector circuit as the primary controller.

13. The method of claim 9, further comprising acknowledging the debug and test control according to a bus standard.

14. The method of claim 9, wherein the debug and test control is a sole control when switched to the debug and test tool.

15. The method of claim 9, wherein the wirelessly connecting comprises wirelessly connecting the debug and test tool through the wireless connector circuit to a multiple pin Joint Test Action Group (JTAG) interface.

16. The method of claim 9, wherein the device circuit comprises an internal debug and test tool.

17. A non-transitory machine readable medium that stores code that when executed by a machine causes the machine to perform a method comprising:
   wirelessly connecting a debug and test tool to a wireless connector circuit;
   switching a debug and test control, with a switching circuit coupled between a device circuit and the wireless connector circuit, from the wireless connector circuit to the debug and test tool wirelessly connected to the wireless connector circuit; and
   performing a debug and test operation on the device circuit with the debug and test tool having the debug and test control.

18. The non-transitory machine readable medium of claim 17, further comprising performing a debug and test operation on the wireless connector circuit with the debug and test tool having the debug and test control.

19. The non-transitory machine readable medium of claim 17, wherein the switching of the debug and test control comprises stalling the wireless connector circuit as a primary controller.

20. The non-transitory machine readable medium of claim 19, wherein sending a request by the debug and test tool to perform the debug and test operation causes the stalling of the wireless connector circuit as the primary controller.

21. The non-transitory machine readable medium of claim 17, further comprising acknowledging the debug and test control according to a bus standard.

22. The non-transitory machine readable medium of claim 17, wherein the debug and test control is a sole control when switched to the debug and test tool.

23. The non-transitory machine readable medium of claim 17, wherein the wirelessly connecting comprises wirelessly connecting the debug and test tool through the wireless connector circuit to a multiple pin Joint Test Action Group (JTAG) interface.

24. The non-transitory machine readable medium of claim 17, wherein the device circuit comprises an internal debug and test tool.

\* \* \* \* \*